United States Patent
Batdorf et al.

(10) Patent No.: US 12,460,717 B2
(45) Date of Patent: Nov. 4, 2025

(54) REACTION CABLE DIFFERENTIAL INTERLOCK SYSTEM AND OFF-ROAD VEHICLE INCLUDING SAME

(71) Applicant: Honda Motor Co., Ltd., Tokyo (JP)

(72) Inventors: Scott D. Batdorf, Bellefontaine, OH (US); Lee N. Bowers, Springfield, OH (US); Tony T. Do, Marysville, OH (US); Bradford A. Mcdavid, Urbana, OH (US); Wade W. Nelson, Marysville, OH (US); Shane R. Smith, Bellefontaine, OH (US); Jason A. Sovern, Marysville, OH (US); Michael J. Willm, Delaware, OH (US); Matthew P. Woolston, Hilliard, OH (US); Raghavendra Krishna Tej Bhamidipati, Beavercreek, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 864 days.

(21) Appl. No.: 17/728,084

(22) Filed: Apr. 25, 2022

(65) Prior Publication Data

US 2023/0341047 A1 Oct. 26, 2023

(51) Int. Cl.
*F16H 59/10* (2006.01)
*F16H 48/20* (2012.01)
*F16H 59/02* (2006.01)

(52) U.S. Cl.
CPC ............ *F16H 59/10* (2013.01); *F16H 48/20* (2013.01); *F16H 59/0278* (2013.01); *F16H 2048/204* (2013.01); *F16H 2059/0221* (2013.01)

(58) Field of Classification Search
CPC ....... F16H 2059/0221; F16H 2048/204; F16H 59/0278; F16H 59/10; F16H 48/20
USPC .......... 180/333, 336, 250; 74/473.15, 473.14
See application file for complete search history.

(56) References Cited

U.S. PATENT DOCUMENTS

| | | | |
|---|---|---|---|
| 3,972,249 A * | 8/1976 | Hansen | G05G 13/00 74/526 |
| 4,054,187 A | 10/1977 | Sbarro | |
| 5,366,041 A | 11/1994 | Shiraishi et al. | |
| 7,690,468 B2 | 4/2010 | Nozaki et al. | |
| 7,770,485 B2 | 8/2010 | Suzuki | |
| 7,784,582 B2 | 8/2010 | Takahashi et al. | |

(Continued)

FOREIGN PATENT DOCUMENTS

| | | |
|---|---|---|
| CN | 103807434 B | 11/2017 |
| DE | 3921323 A1 | 6/1990 |
| JP | 2017072225 A | 4/2017 |

*Primary Examiner* — T. Scott Fix
(74) *Attorney, Agent, or Firm* — KENEALY VAIDYA LLP

(57) ABSTRACT

A reaction cable differential interlock system can include a differential lock lever, a shift lever, a mode select lever, a linkage mechanism, and a single cable. The differential lock lever can be configured to be movably mounted on a differential gear assembly and connected to a differential lock collar of the differential gear assembly. The shift lever can be movable between a plurality of transmission mode positions and the mode select lever can be movable between a plurality of differential mode positions. The linkage mechanism can be coupled to the shift lever and the mode select lever, and the single cable can extend from the linkage mechanism to the differential lock lever.

20 Claims, 12 Drawing Sheets

(56) References Cited

U.S. PATENT DOCUMENTS

| | | |
|---|---|---|
| 8,100,805 B2 | 1/2012 | Dayton |
| 8,292,774 B2 | 10/2012 | Haggerty |
| 8,725,376 B2 | 5/2014 | Murota et al. |
| 8,939,248 B2 | 1/2015 | Seegert et al. |
| 8,986,152 B2 | 3/2015 | Sato et al. |
| 9,346,352 B2 | 5/2016 | Karube et al. |
| 9,573,465 B2 | 2/2017 | Nishida et al. |
| 9,657,828 B2 | 5/2017 | Larsson |
| 10,024,430 B2 | 7/2018 | Spooner et al. |
| 10,443,723 B2 | 10/2019 | Bormann |

* cited by examiner

REACTION CABLE DIFFERENTIAL INTERLOCK SYSTEM AND OFF-ROAD VEHICLE INCLUDING SAME

BACKGROUND

The disclosed subject matter relates to a reaction cable differential interlock system. More particularly, the disclosed subject matter relates to methods and apparatus that can lock a differential assembly when a shift lever places a multiple speed ratio transmission in a park mode.

A vehicle can include a multiple speed ratio transmission and a differential gear assembly that distributes a drive torque from the transmission to a pair of drive wheels. The transmission can include an output shaft and a parking mechanism that locks rotation of the output shaft when engaged. The output shaft can be connected to the rear differential by a propeller shaft.

The differential gear assembly can permit one of the drive wheels to rotate faster (or slower) than the other of the drive wheels when the vehicle travels along a curved path. However, when one of the drive wheels loses traction, the differential gear assembly will distribute most or all of the drive torque to the drive wheel that has lost traction and little or no torque to the drive wheel that has traction. Thus, the vehicle can become stuck, and the drive wheels will not propel the vehicle along the desired path until both wheels regain traction with the travel surface.

Some differential gear assemblies can include an unlocked mode and a locked mode. The differential gear assembly can drive both wheels at the same speed and in the same direction when operating in the locked mode. Thus, the locked mode can prevent the vehicle from getting stuck when one of the drive wheels loses traction. The unlocked mode can permit the differential assembly to drive the wheels at different speeds or at the same speed to better handle turns, for example, on a paved surface. The differential gear assembly can include additional structure such as, but not limited to, a clutch assembly, specialized gears, or a lock collar, that can permit manual or automated selection and de-selection of the locked mode.

SUMMARY

Some embodiments are directed to a reaction cable differential interlock system that can include a differential lock lever, a shift lever, a mode select lever, a linkage mechanism, and a single cable. The differential lock lever can be configured to be movably mounted on a differential gear assembly and connected to a differential lock collar of the differential gear assembly. The shift lever can be movable between a plurality of transmission mode positions and the mode select lever can be movable between a plurality of differential mode positions. The linkage mechanism can be coupled to the shift lever and the mode select lever, and the single cable can extend from the linkage mechanism to the differential lock lever.

Some embodiments are directed to a reaction cable differential interlock system for selectively moving a differential lock collar of a differential gear assembly between a locked state and an unlocked state. The reaction cable differential interlock system can include a lock lever, a mode select lever, a shift lever, a linkage mechanism, and a single cable. The lock lever can be movably mounted on the differential gear assembly and connected to the differential lock collar, the lock lever being movable between a locked position configured to place the differential lock collar in the locked stated and an unlocked position configured to place the differential lock collar in the unlocked stated. The mode select lever can be movable between a locked mode position and an unlocked mode position, and the shift lever can be movable between a park position and a plurality of drive mode positions. The linkage mechanism coupled to the mode select lever and the shift lever, and the single cable connecting the linkage mechanism to the lock lever.

Some embodiments are directed to a reaction cable differential interlock system that can include a shift lever, a mode select lever, a linkage mechanism, a lock lever, and a cable. The shift lever can be movable between a plurality of transmission mode positions and the mode select lever can be movable between a plurality of differential mode positions. The linkage mechanism can be coupled to the shift lever and the mode select lever, and the lock lever can be movable between a locked position and an unlocked position. The cable can extend from the linkage mechanism to the differential lock lever, and be configured to transmit motion of both the shift lever and mode select lever to the differential lock lever. The linkage mechanism can be connected to the cable at two different locations on the cable.

BRIEF DESCRIPTION OF THE DRAWINGS

The disclosed subject matter of the present application will now be described in more detail with reference to exemplary embodiments of the apparatus and method, given by way of example, and with reference to the accompanying drawings, in which.

DETAILED DESCRIPTION OF EXEMPLARY EMBODIMENTS

A few inventive aspects of the disclosed embodiments are explained in detail below with reference to the various figures. Exemplary embodiments are described to illustrate the disclosed subject matter, not to limit its scope, which is defined by the claims. Those of ordinary skill in the art will recognize a number of equivalent variations of the various features provided in the description that follows.

Figure 1:
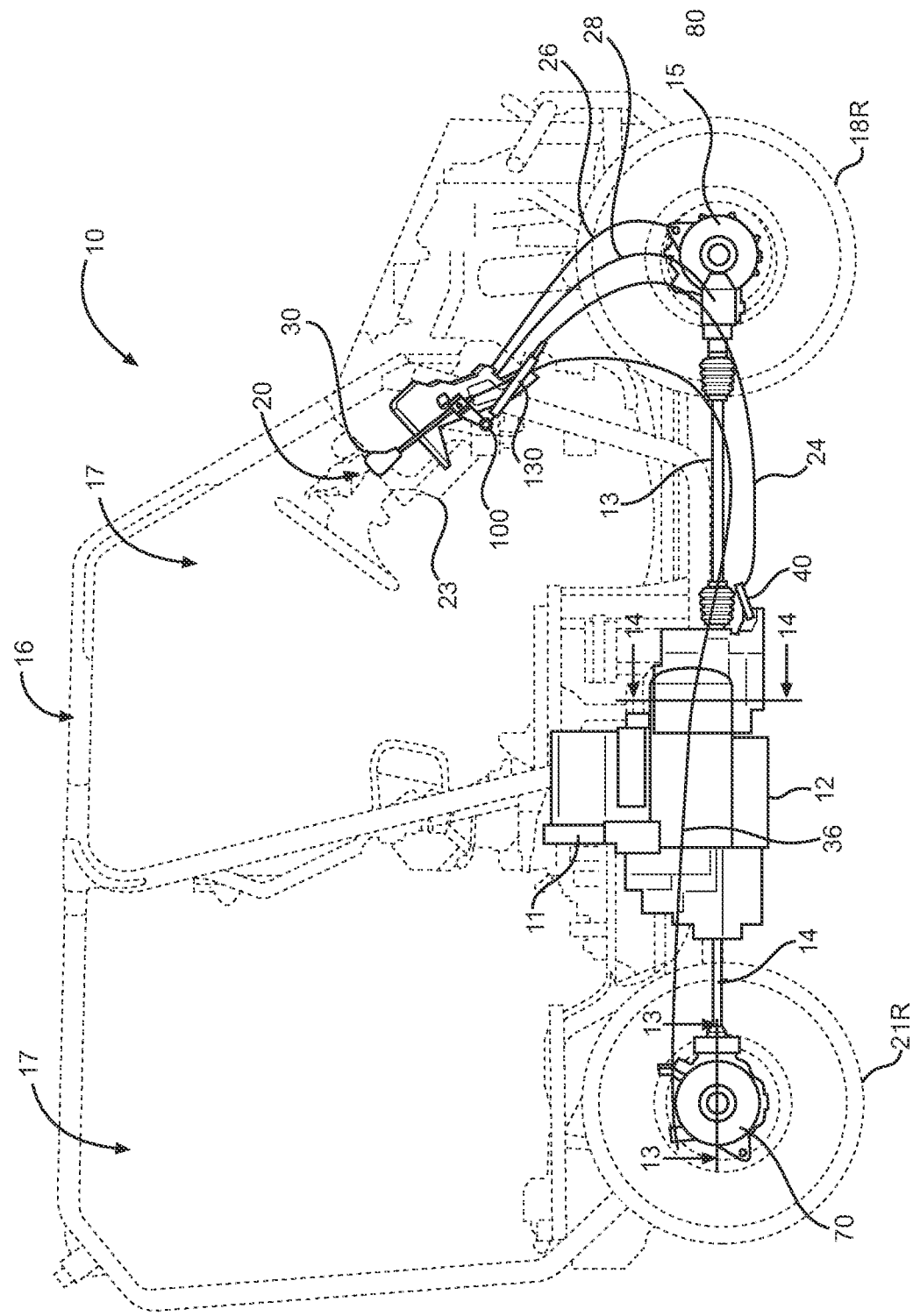
FIG. 1 is a side view of a vehicle including a reaction cable differential interlock system made in accordance with principles of the disclosed subject matter.

FIG. 1 illustrates an embodiment of a vehicle 10 including a reaction cable differential interlock system 20 made in accordance with principles of the disclosed subject matter. The reaction cable differential interlock system 20 ("system 20") can include a shift lever 30, a mode select lever 32, a linkage mechanism 34, and a single cable 36. The system 20 can permit the driver of the vehicle 10 to use the shift lever 30 to place a multiple speed ratio transmission 12 ("transmission 12") in a park mode and a rear differential assembly 70 in a locked mode when the driver places the shift lever 30 in a park slot 46 (see FIG. 2) by manipulating the single cable 36.

The vehicle 10 shown in FIG. 1 can be specialized for use on an unimproved path or on an unmarked path, and can be referred to as a multipurpose utility vehicle (MUV) or as a side-by-side all-terrain vehicle (SxS, or SxS ATV). The vehicle 10 can include a power source 11, the transmission 12, a front propeller shaft 13, a rear propeller shaft 14, a front differential assembly 15, a frame assembly 16, a pair of front wheels 18L, 18R, a pair of rear driveshafts 19L, 19R (see FIG. 13), a pair of rear wheels 21L, 21R, the rear differential gear assembly 70 and an instrument panel 23. The frame assembly 16, the right side wheels 18R, 21R and the instrument panel 23 are shown in phantom to more clearly show the powertrain and the system 20. The left side wheels 18L, 21L are obstructed from view in FIG. 1 and can have the same or similar structure as the right side wheels 18R, 21R. The front differential assembly 15 can distribute power transmitted by the transmission 12 via the front propeller shaft 13 to the front wheels 18L, 18R. The rear differential assembly 70 can distribute power transmitted by the transmission 12 via the rear propeller shaft 14 to the rear wheels 21L, 21R.

In order to maximize tractive effort, the front differential assembly 15 and the rear differential assembly 70 can each include a lock mechanism that locks the differential gearing so that the differential assemblies 15, 70 drive the respective wheels 18L, 18R, 21L, 21R with equal torque at all times. The wheel(s) with the greatest traction can propel the vehicle 10, even when one or more of the wheels 18L, 18R, 21L, 21R has less traction or no traction. However, it may be advantageous to operate the vehicle 10 in a rear wheel drive mode and the rear differential assembly 70 in an unlocked mode (also referred to as an open mode) when driving along certain surfaces such as but not limited to a surface covered by grass and/or other vegetation or through various drive paths such as curved paths to avoid "wheel chirp" when one wheel is moving along a longer arc than another wheel (i.e., when taking a turn) and must rotate more than another wheel in a given time period. Thus, both differentials 15, 70 can be selectively operated in the unlocked mode or the locked mode.

The unmarked path or unimproved path can include different surfaces having different coefficients of friction and the vehicle 10 can be parked with the transmission 12 in the park mode and one of the drive wheels (for example, the left rear wheel 21L) on a lower friction surface than the surface on which the other of the drive wheels (for example, the right rear wheel 21R) is located. Alternatively, the vehicle 10 can be parked on an inclined surface such that one of the drive wheels is lifted off the ground or under a lighter vehicle load than the other drive wheel. Under either of these conditions, the rear differential assembly 70 can permit the vehicle 10 to travel down the inclined surface when the rear differential assembly 70 is placed in the unlocked mode, despite the transmission 12 being placed in the park mode.

For example, assuming the left rear wheel 21L has more traction than the right rear wheel 21R, the rear differential assembly 70 can include structure (can be placed in an open or unlocked configuration) that permits the left rear wheel 21L to rotate to roll down the inclined surface while the rear differential assembly 70 drives the right rear wheel 21R in the opposite rotational direction while it slips over or on the surface or is raised above the surface. Thus, it can be advantageous to operate the rear differential assembly 70 in the locked mode when the transmission 12 is placed in the park mode.

The mode select lever 32 can selectively manipulate the cable 36 to lock and unlock the rear differential assembly 70. However, in some vehicles, the shift lever 30 is not connected to the cable 36. Thus, the operator should place the rear differential 70 in the locked mode before or after engaging the parking mechanism 60, but before exiting the vehicle 10. The operator can perceive this sequence of operations as inconvenient. Further, it is possible for an inexperienced person to not know this sequence or possibly forget to follow this sequence.

It is possible to add additional structure and a second cable to the vehicle 10 that connects the shift lever 30 to the rear differential assembly 70 so that the shift lever 30 can place the rear differential assembly 70 in the locked mode when the shift lever 30 places the transmission 12 in the park mode. However, this additional structure can add weight, add complexity to the vehicle 10, and be labor intensive to assemble and maintain.

The reaction cable differential interlock system 20 can advantageously permit the operator to simultaneously lock the rear differential assembly 70 when the operator places the shift lever 30 in a park slot 46 using the same cable 36 that is manipulated by the mode select lever 32. Thus, the system 20 can permit the operator of the vehicle 10 to place the transmission 12 in the park mode and the rear differential 70 in the locked mode simply by placing the shift lever 30 in a park slot 46 without any further input by the operator. Further, the system 20 can avoid the added weight, complexity and labor intensive disadvantages of other structures that can connect the shift lever 30 to the rear differential assembly 70.

The vehicle 10 can be configured to selectively operate in a two-wheel drive mode or a four-wheel drive mode and the transmission 12 can be configured to operate in the park mode, a reverse drive mode, a neutral mode, a forward drive mode, and a low drive mode. The vehicle 10 can include a selector assembly 22 that can permit the operator of the vehicle 10 to select one of the operational modes of the vehicle 10 and one of the operational modes of the transmission 12. The selector assembly 22 can include the system 20. The selector assembly 22 can be configured to permit the operator of the vehicle 10 to manually lock the rear differential assembly 70 alone or to lock the rear differential assembly 70 and the front differential assembly 15.

Referring to FIGS. 1-4 collectively, the selector assembly 22 can include a transmission control cable 24, a front differential control cable 26 and a front clutch control cable 28. The system 20 can include a rear differential control cable 36. The cables 24, 26, 28 are omitted from FIG. 2 and the mode select lever 32 and the linkage mechanism 34 are omitted from FIG. 1 for clarity and simplicity of the drawings. The cables 24, 26, 28, 36 can be configured as a Bowden cable that includes an inner wire and an outer housing through which the inner wire slides.

A first end of the transmission control cable 24 can be connected to the shift lever 30 and a second end can be connected to the transmission 12. The transmission 12 can include an actuator 40 that is connected to the transmission control cable 24 and the inner operational structure of the transmission 12. An operator of the vehicle 10 can manipulate the shift lever 30 and the transmission control cable 24 can transmit the operator's input to the actuator 40, which in turn, selectively operates the transmission 12 in the park mode, the reverse drive mode, the neutral mode, the forward drive mode, and the low drive mode.

A first end of the cable 36 can be connected to the mode select lever 32 and a second end can be connected to the rear differential assembly 70. The rear differential assembly 70 can include locking structure(s) that are connected to the cable 36. An operator of the vehicle 10 can manipulate the mode select lever 32 and the cable 36 can transmit the operator's input to the locking structure(s) of the rear differential assembly 70, which in turn, selectively places the rear differential assembly 70 in the locked mode or the unlocked mode.

Figure 13:
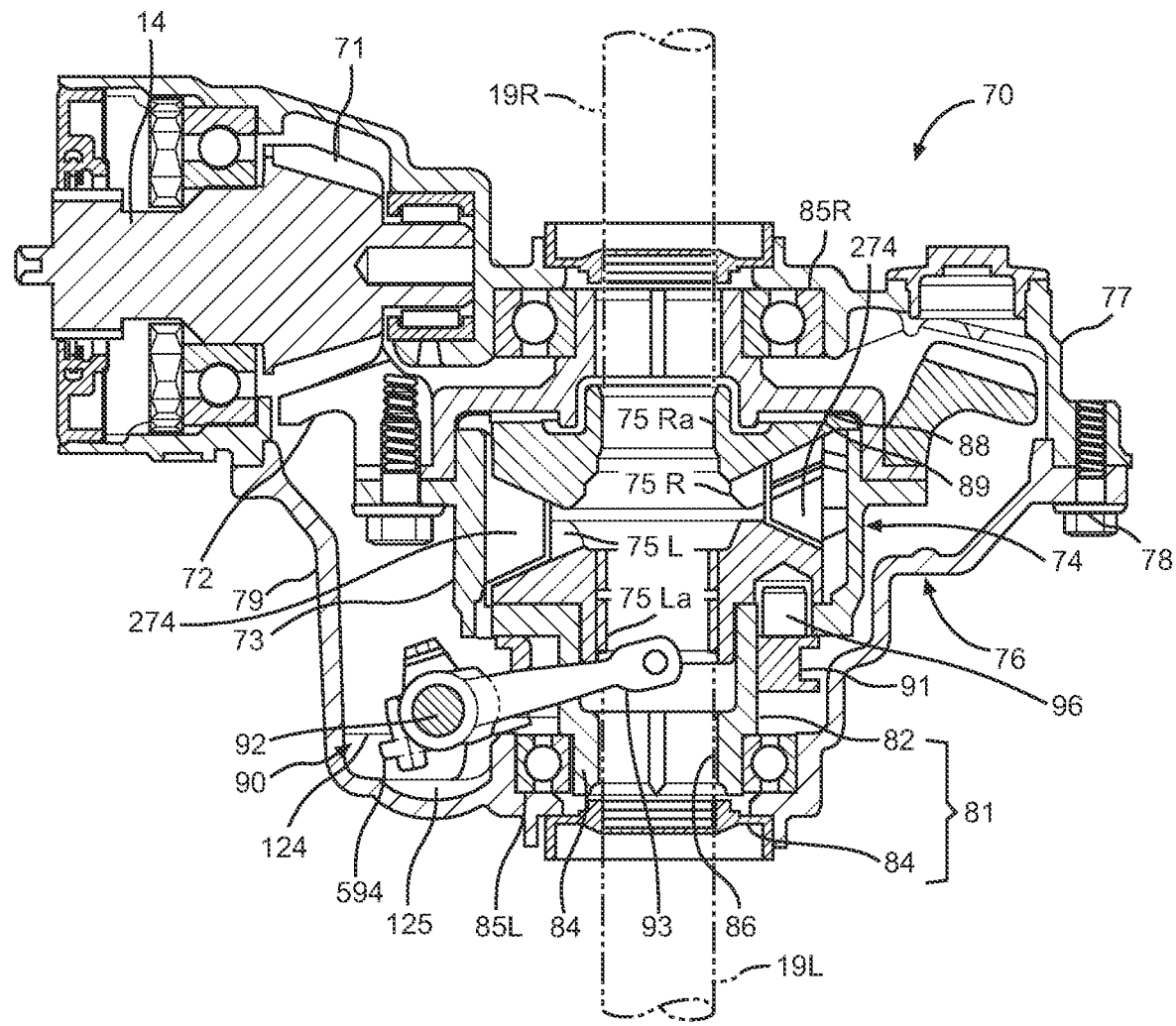
FIG. 13 is a cross-section view of the rear differential assembly taken along line 13-13 of FIG. 1.
Figure 14:
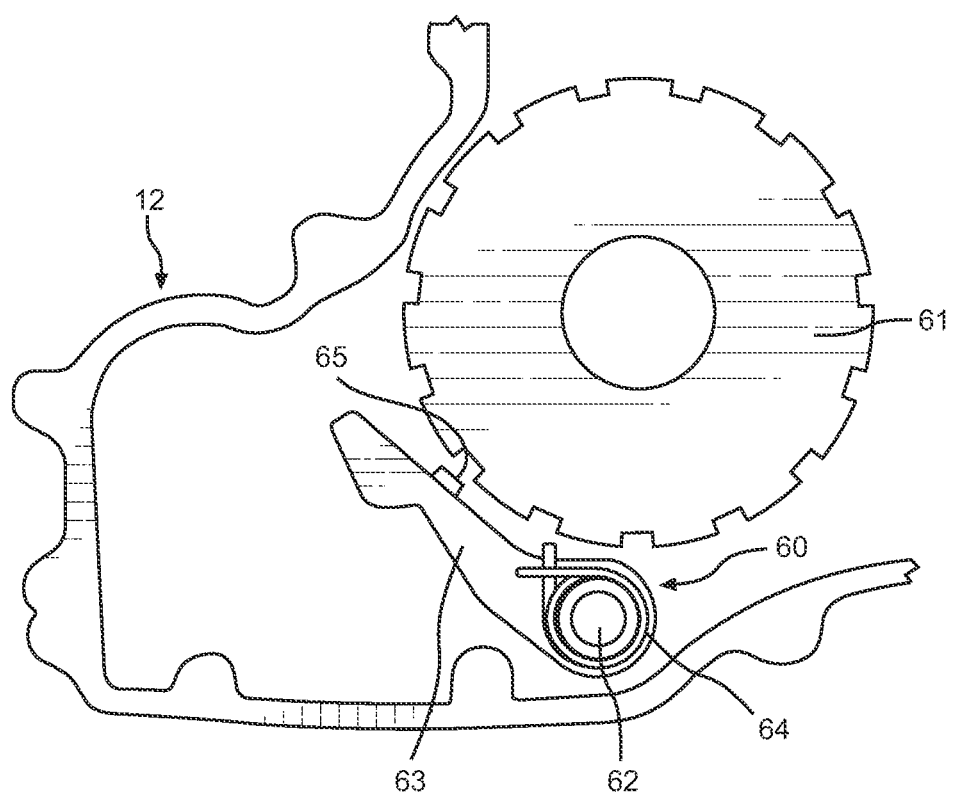
FIG. 14 is a cross-sectional view taken along line 14-14 of FIG. 1 and shows a parking mechanism of a transmission of the vehicle.

Referring to FIG. 14, the transmission 12 can include a park mechanism 60 which locks rotation of an output shaft of the transmission 12, and by extension, the rotation of the rear propeller shaft 14, the rear drive shafts 19L, 19R and the rear wheels 21L, 21R (see FIG. 13) and possibly locks rotation of the front propeller shaft 13 and the front wheels 18L, 18R depending on an operational state of a clutch to be described later. The parking mechanism 60 can include a parking gear 61, a pawl arm shaft 62 connected to the transmission control cable 24, a pawl arm 63 rotated by the pawl arm shaft 62, a return spring 64 biasing the pawl arm 63 away from the parking gear 61, and a pawl 65. The operator can manipulate the shift lever 30 (see FIGS. 1 and 2) to cause the pawl arm 63 to rotate against the return spring 64 shown in FIG. 14 so that the pawl 65 meshes with the parking gear 61. The parking mechanism 60 can lock rotation of the rear propeller shaft 14 (and possibly the front propeller shaft 13) when the pawl 65 meshes with the parking gear 61.

However, under certain special circumstances of the travel path, the rear differential assembly 70 can permit one of the rear wheels 21L, 21R to drive the other of the rear wheels 21L, 21R if the rear differential assembly 70 is not placed in the locked mode even though the parking mechanism 60 locks rotation of the rear propeller shaft 14.

Referring to FIG. 13, the rear differential assembly 70 can selectively transmit and distribute torque output from the transmission 12 to drive the rear driveshafts 19L, 19R and be selectively operated in the locked mode (also referred to as a locked differential) and the unlocked mode (also referred to as an open mode or opened differential or open differential). When the rear differential assembly 70 is operated in the unlocked mode, the rear differential assembly 70 can drive the rear driveshafts 19L, 19R at the same speed in the same direction, or at different speeds in the same direction, or under certain special conditions at the same speed in opposite directions. When the rear differential assembly 70 is operated in the locked mode, the rear differential assembly 70 can drive the rear driveshafts 19L, 19R only at the same speed and only in the same direction. The front differential assembly 15 can also be operated in a locked mode and an unlocked mode similar in function to that described above for the rear differential assembly 70. The locked mode and the unlocked mode of the differential assemblies 15, 70 are described with respect to the rear differential assembly 70 shown in FIG. 13. The front differential assembly 15 can include structure that is the same as or similar to the structure of the rear differential assembly.

The rear differential assembly 70 can include a pinion gear 71, a ring gear 72, a differential mechanism 74, a gear casing 76, and a differential lock mechanism 90. The pinion gear 71 can be mounted on an end portion of the rear propeller shaft 14. The ring gear 72 can mesh with the pinion gear 71 and the differential casing 73 can rotate together with the ring gear 72. The differential mechanism 74 can include in a differential casing 73, output cams 75L, 75R and a set of cam followers 274. The output cams 75L, 75R and the cam followers 274 can be capable of making a difference in rotational speed between the rear wheels 21L, 21R. The output cams 75L, 75R can be portions of the differential mechanism 74 and transmit the torque that is input to the ring gear 72 to the drive shafts 19L, 19R respectively. The gear casing 76 can house the ring gear 72 and the differential casing 73.

The differential mechanism 74 can include a washer (shim) 88 and a disc spring 89 interposed between the ring gear 72 and the right output cam 75R. The right output cam 75R can be biased toward a left output cam 75L.

Spline grooves 75La can be formed on the left output cam 75L, and one end of the drive shaft 19L can be connected to the spline grooves 75La. Similarly, spline grooves 75Ra can be formed on the right output cam 75R, and one end of the drive shaft 19R can be connected the spline grooves 75Ra.

The gear casing 76 can include a first casing half body 77 rotatably supporting the pinion gear 71, and a second casing half body 79 connected to the first casing half body 77 using bolts 78. The differential lock mechanism 90 can be housed in the second casing half body 79.

The differential casing 73 can be rotatably mounted on the gear casing 76 by a pair of bearings 85L, 85R. A portion of the differential casing 73 away from the ring gear 72 can be formed into a cylindrical shaft 81 that has a diameter narrowed toward one end thus forming a large-diameter portion 82 and a small-diameter portion 84. The small-diameter portion 84 can be supported on the gear casing 76 by way of the left bearing 85L.

The differential lock mechanism 90 can include a lock collar 91, a rotary shaft 92, a shift fork 93, a torsion spring 594, and one or more differential lock pins 96 (pin(s) 96"). The lock collar 91 can slide axially along the large-diameter portion 82.

The rotary shaft 92 can be rotatably mounted on the second casing half body 79 adjacent to the left bearing 85L. The shift fork 93 can be mounted on a middle portion of the rotary shaft 92 and fitted in the slide member 91.

Figure 2:
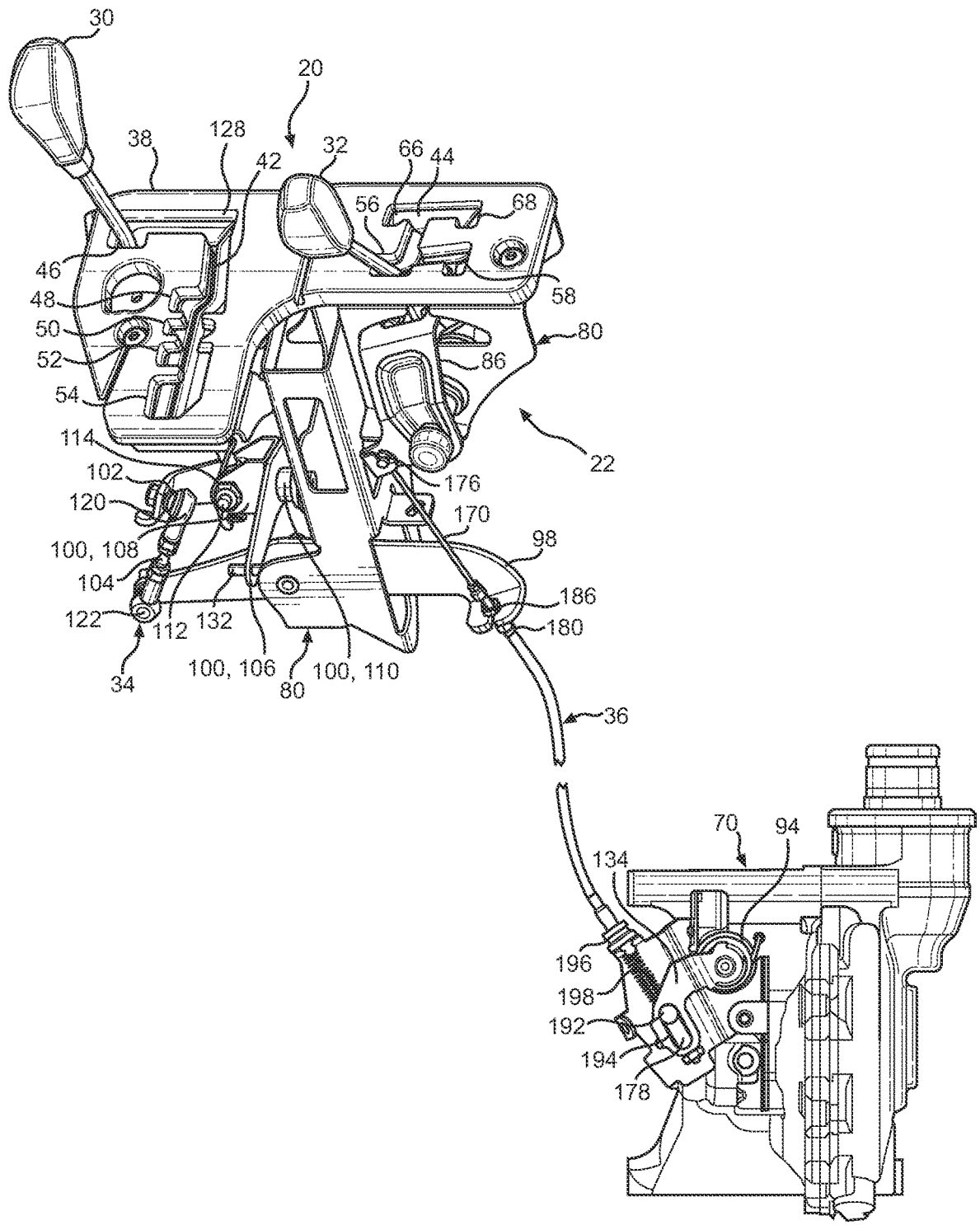
FIG. 2 is a perspective top view of the reaction cable differential interlock system connected to a rear differential assembly of the vehicle of FIG. 1.
Figure 11:
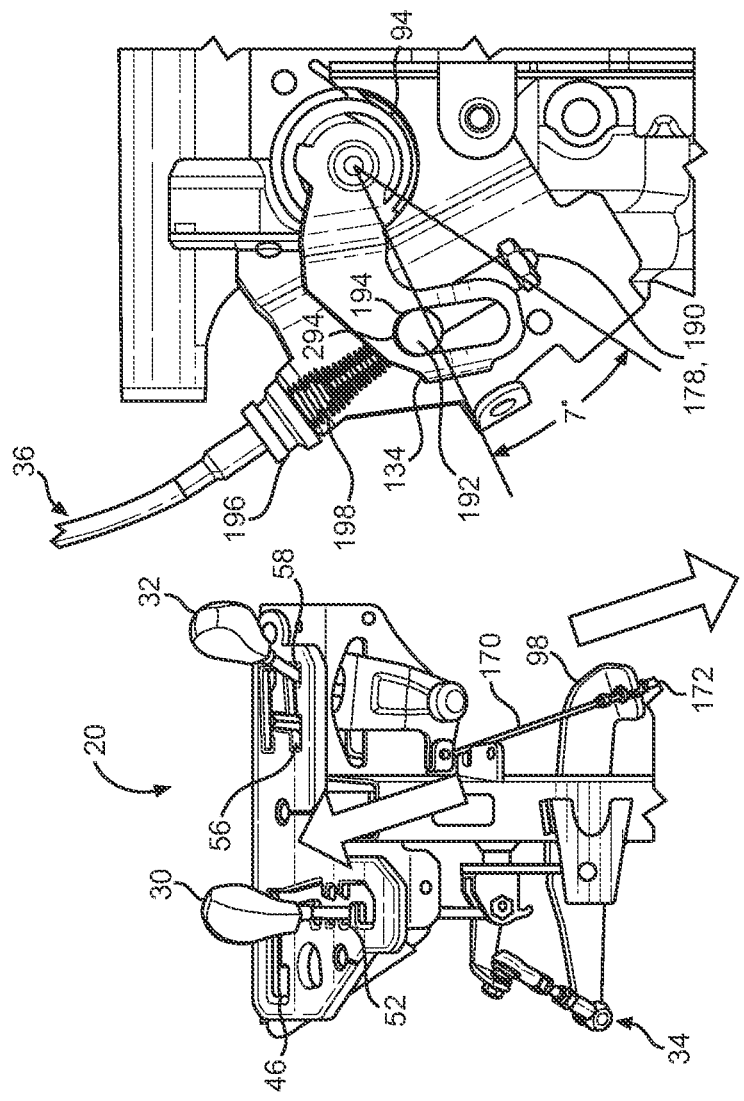
FIGS. 11A-11C show a shift pattern range, locations of the shift lever and the mode select lever, and a location of the lock lever, respectively, when the shift lever is in the drive slot and the mode select lever is in the unlock slot.

Referring to FIG. 2, the system 20 can include a lock lever 134 mounted on the rotary shaft 92. The cable 36 can transmit motion of the mode select lever 32 to the lock lever 134 to cause the lock lever 134 to pivot between a locked position shown in FIG. 2 and an unlocked position shown in FIG. 11C. The lock lever 134 can rotate the rotary shaft 92 as the lock lever 134 pivots between the locked position and the unlocked position. The lock lever 134 can cause the shift fork 92 to move the lock collar 91 into the locked position when the lock lever 134 is in the locked position and causes shift fork 92 to move the lock collar 91 to the unlocked position when the lock lever 134 is in the unlocked position.

The rotary shaft 92 can be biased in the counterclockwise direction as viewed in FIG. 13 by a torsion spring 94 (see FIGS. 2 and 8-12) mounted on the second casing half body 79. The shift fork 93 can slide the lock collar 91 toward the differential casing 73. The pin 96 can be mounted on the lock collar 91 and engage the left output cam 75L to lock rotation of the left output cam 75L and place the differential gearing 74 into locked mode. The torsion spring 94 can bias the rotary shaft 92 in a direction that causes the pin 96 to engage the differential casing 73 when an external force is not applied to the lock lever 134.

When the lock lever 134 causes the rotary shaft 92 to move in the clockwise direction as viewed in FIG. 13 by movement of the mode select lever 32 into an unlock slot 58 (see FIGS. 2, 3 and 5), the rotary shaft 92 can move the shift fork 93. As a result, the lock collar 91 can move in the direction away from the differential casing 73 and the pin 96 disengages from the left output cam 75L. Thus, the left output cam 75L can be rotationally unlocked, and the rear differential assembly 70 is placed in the unlocked mode.

Instead of connecting both of the lock lever 134 and the shift fork 93 directly to the rotary shaft 92, the torsion spring 594 can connect either lock lever 134 or the shift fork 93 to the rotary shaft 92. The torsion spring 594 can be referred to as a lost motion coupling. The torsion spring 594 can permit relative rotation between the shift fork 93 and the lock lever 134 when the lock collar 91 is stuck or otherwise immovable from the locked position. For example, it can be possible for an operator of the vehicle 10 to move the mode select lever 32 into the two-wheel drive slot 56 when there is a cross system frictional torque between the right rear driveshaft 19R/right output cam 75R and the left rear driveshaft 19L/left output cam 75L. Under this condition, the force required to remove the pin 96 from the left output cam 75L can exceed the force that the lock lever 134 can transmit to the lock collar 91. The torsion spring 594 can absorb the motion input by the lock lever 134 and prevent damage to the system 20, the shift fork 93, and/or the lock collar 91 when the cross system frictional torque is present.

When the parking mechanism 60 is engaged, the pinion gear 71, the ring gear 72 and the differential casing 73 are rotationally locked. However, the output cams 75L, 75R are free to rotate when the differential lock mechanism 90 places the differential mechanism 74 in the unlocked mode. When the vehicle 10 is parked on an inclined surface, each of the rear wheels 21L, 21R can apply a rotational input to a respective one of the driveshafts 19L, 19R. The differential mechanism 74 can transmit the rotational input by one of the rear driveshafts 19L, 19R into a rotational output to the other of the driveshafts 19L, 19R, which rotational output is opposite in direction to the rotational input by the one of the driveshafts 19L, 18R. The rotational inputs from the rear wheels 19L, 19R can equally balance the rotational outputs by the unlocked differential mechanism 74 and the parking mechanism 60 can hold the vehicle 10 stationary on the inclined surface. However, the equal balance can be lost and one of the rear wheels 21L, 21R can cause the differential mechanism 74 to drive the other of the rear wheels 21L, 21R in the opposite direction when one of the rear wheels 21L, 21R has less traction that the other of the rear wheels 21L, 21R.

By simply placing the shift lever 30 in the park slot 46, the operator can place the rear differential assembly 70 in the locked mode while also placing the transmission 12 in the park mode. Thus, the rear wheels 21L, 21R can be locked against rotation if the vehicle 10 is parked on an inclined surface and one of the rear wheels 21L, 21R has no traction or less traction than the other of the rear wheels 21L, 21R.

Returning to FIGS. 2, 3 and 5, the system 20 can include a shift plate 38 that has a first gate slot 42 and a second gate slot 44. The shift lever 30 can pass through and move along the first gate slot 42 and the mode select lever 32 can pass through and move along the second gate slot 44. The first gate slot 42 can include the park slot 46, a reverse slot 48, a neutral slot 50, a drive slot 52 and a low slot 54. The second gate slot 44 can include a two-wheel drive slot 56, the unlock slot 58, a four-wheel drive slot 66, and an all-lock slot 68.

Figure 4:
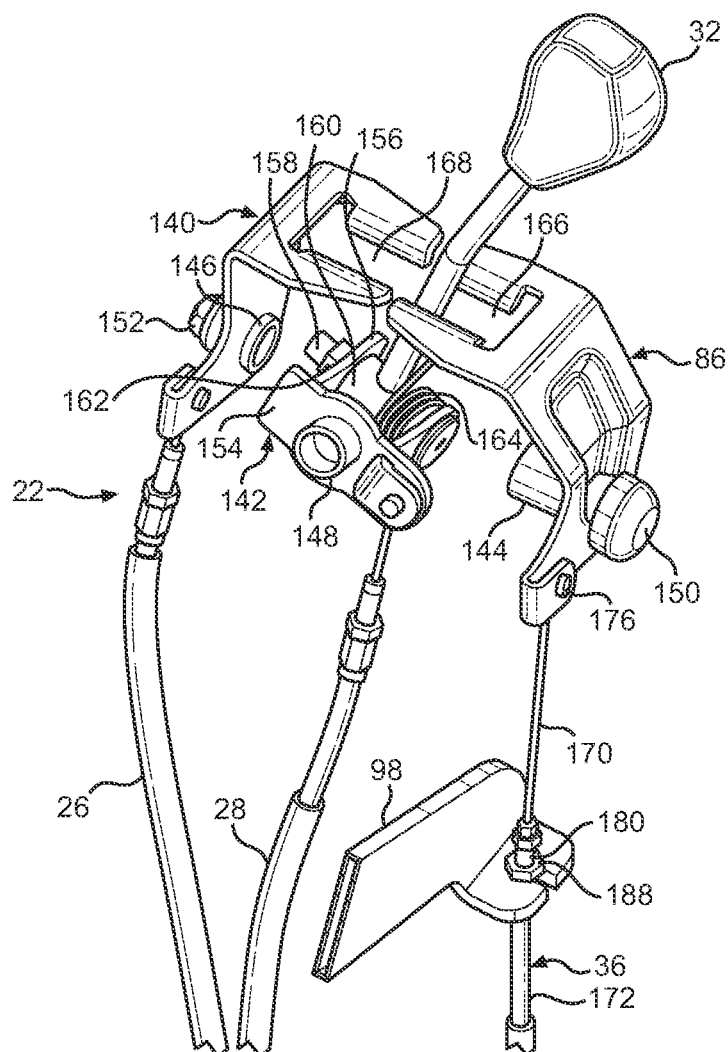
FIG. 4 is a top perspective view of a mode select lever and a portion of a linkage mechanism of the reaction cable differential interlock system of FIG. 2.
Figure 5:
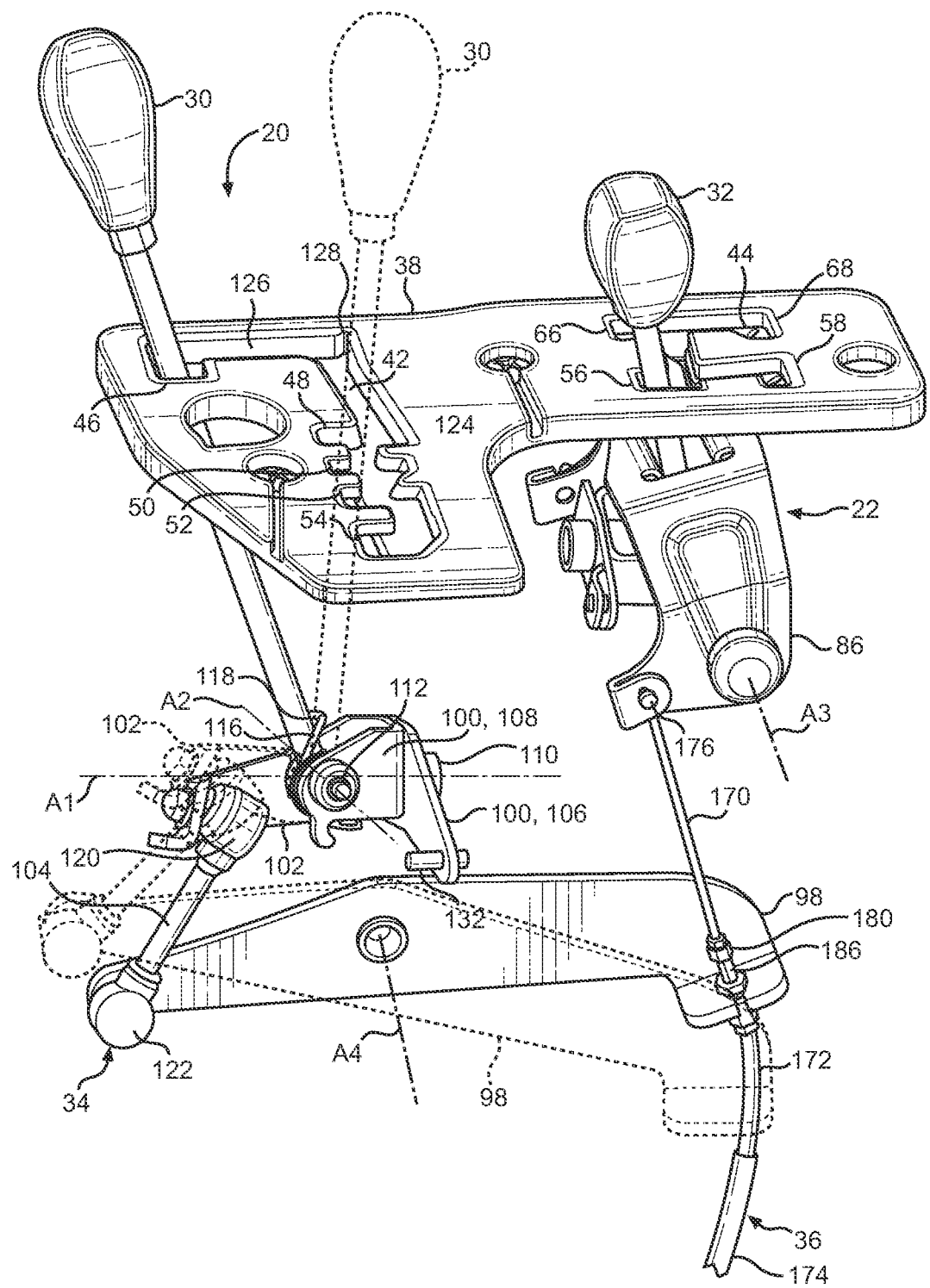
FIG. 5 is a top perspective view of the reaction cable differential interlock system of FIG. 2 and shows two operating positions of the linkage mechanism.

Referring to FIGS. 2, 4 and 5 collectively, the system 20 can include a bracket structure 80, and the linkage mechanism 34 can include a first interlock lever 86, a second interlock lever 98, a first link 100, an arm 102, and a second link 104. The mode select lever 32 can pivot the first interlock lever 86 and the cable 36 can transmit this movement to the lock lever 134 to selectively operate the rear differential assembly 70 in the locked mode or the unlocked mode. The arm 102, the second link 104 and the second interlock lever 98 can connect the first link 100 (and the shift lever 30) to the cable 36 so that the shift lever 30 can input a movement to the cable 36 that causes the lock lever 136 to selectively operate the rear differential assembly 70 in the locked mode or the unlocked mode.

The first link 100 can include a first bracket 106 and a second bracket 108 that pivotally connect the shift lever 30 to the bracket structure 80. The bracket structure 80 can be connected to the instrument panel 23 and/or to the frame assembly 16. The bracket structure 80 can include a single bracket or a plurality of brackets.

Referring to FIGS. 2 and 5, the first link 100 can include a collar 110 that is rotatably mounted on a threaded shaft or bolt (not shown) that is connected to the bracket structure 80. A threaded nut can secure the collar 110 onto the threaded shaft in the same manner or similar manner as described below with respect to the second bracket 108. The second bracket 108 can be connected to the first bracket 106 so that the brackets 106, 108 move as a unit and do not move relative to each other. The first bracket 106 together with the second bracket 108 can pivot relative to the bracket structure 80 about the threaded shaft via the collar 110.

The second bracket 108 can be supported on and connected to the first bracket 106 and can have a general U-shape with the base of the U-shape abutting the first bracket 106. A threaded shaft 112 can pass through the two legs of the U-shape. The shift lever 30 can include a collar (not shown) rotatably mounted on the threaded shaft 112 at a location that is between the two legs of the U-shape. The collar of the shift lever 30 is obstructed from view by the second bracket 108. The shift lever 30 can pivot relative to the second bracket 108 about the threaded shaft 112. A nut 114 and the threaded shaft 112 can secure the shift lever 30 to the second bracket 108.

The system 20 can include a biasing structure 116 connected to each of the second bracket 108 and the shift lever 30 to bias the shift lever 30 toward the park slot 46 and toward the slots 48, 50, 52, 54. For example, the biasing structure 116 can be a coil spring that includes a first end 118 connected to the shift lever 30 and a second end connected to the second bracket 108. The second end is obstructed from view by the second bracket 108. The threaded shaft 112 can pass through the center of the coil of the biasing structure 116.

The arm 102 can be fixed to the shift lever 30 to move in unison with the shift lever 30. That is, the arm 102 can pivot relative to the first link 100.

The second link 104 can include a first end 120 connected to the arm 102 and a second end 122 connected to the second interlock lever 98. The first and second ends 120, 122 can include a pivot coupling such as, but not limited to, a ball and socket joint to accommodate the movement of the second link 104 relative to the arm 102 and the second interlock lever 98.

Referring to FIG. 5, the first gate slot 42 can include a first segment 124 and a second segment 126. The slots 48, 50, 52, 54 can be distributed along the first segment 124, and the second segment 126 can extend from the first segment 124 to the park slot 46. The segments 124, 126 intersect each other at a corner 128. The second segment 126 can have a length that extends from the corner 128 to the park slot 46. Each of the slots 48, 50, 52, 54 can extend away from the first segment by a respective length. The length of the second segment 126 can be larger than the respective lengths of each of the slots 48, 50, 52, 54. The park slot 46 can be located at the end of the second segment 126. The park slot 46 can be located at a position of the shift plate 38 that farther to left, as viewed in FIG. 5, as compared to the slots 48, 50, 52, 54. Thus, when the shift lever moves in the second segment 126 from the first segment to the park slot 46, the shift lever 30 can pivot through a greater arclength as compared to the arclength when the shift lever 30 moves from the first segment 124 into any of the slots 48, 50, 52, 54.

When the shift lever 30 moves along a first segment 124 of the first gate slot 42, the first link 100 can pivot about a first axis A1 centered in the collar 110. When the shift lever 30 moves in the second segment 126, the first link 100 does not pivot and the shift lever 30 can pivot about a second axis A2 centered on the threaded shaft 112.

Returning to FIG. 1, the selector assembly 22 can include a connector 130 that joins the first end of the transmission control cable 24 to the first link 100. Returning to FIGS. 2 and 5, the first link 100 can include a pin 132 fixed to an end of the first bracket 106 and the connector 130 can include a hole through which the pin 130 passes. The connector 130 can be secured to the pin 132 in any appropriate manner such as, but not limited to, a cotter pin, staking, or a threaded fastener. The connector 130 is omitted from FIGS. 2 and 5 for clarity and simplicity of the drawings.

The shift lever 30 can cause the engagement of the parking mechanism 60 when the shift lever 30 moves into the corner 128 and disengagement of the parking mechanism 60 when the shift lever 30 moves to any position along the first segment 124 that is spaced away from the corner 128. Specifically, the transmission control cable 24 can transmit movement of the shift lever 30 about the first axis A1 and into the corner 128 to the actuator 40 so that the pawl 65 engages the parking gear 61 and places the transmission 12 in the park mode.

Further, the shift lever 30 can cause the lock lever 134 to move the lock collar 91 to lock the differential gearing 74 when the shift lever 30 moves from the corner 128 to the park slot 46 if the rear differential assembly 70 is in the unlocked mode. Specifically, the arm 102 and the second interlock lever 98 can transfer the pivoting motion of the shift lever 30 about the second axis A2 to the second interlock lever 98, and the cable 36 can transmit the motion of the second interlock lever 98 to the lock lever 134.

Referring to FIG. 4, the selector system 22 can include a front differential lever 140 and a clutch lever 142. The levers 86, 140, 142 can be pivotally connected to the bracket structure 80. The first interlock lever 86 can include a collar 144, the front differential lever 140 can include a collar 146 and the clutch lever 142 can include a collar 148, all rotatably supported by the bracket structure 80. The collars 144, 146, 148 can have the same or similar shape. The first interlocking lever 86 can be secured to the bracket structure 80 by a fastener 150 that can include a threaded shaft that engages a nut. Threaded fasteners can connect the collars 146, 148 to the bracket structure 80 in the same manner or a similar manner as described above with respect to the first link 100. (See, for example, the threaded member 152 on the front differential lever 140).

The mode select lever 32 can be connected to the clutch lever 142 and can move with the clutch lever 142 when the clutch lever 142 pivots relative to the bracket structure 80 via the collar 148. For example, the clutch lever 142 can include a first bracket 154 and a second bracket 156 connected to the first bracket 154. The second bracket 156 can be connected to the first bracket 154 so that the brackets 154, 156 move as a unit and do not move relative to each other. The first bracket 154 together with the second bracket 156 can pivot relative to the bracket structure 80 about the threaded shaft via the collar 148.

The second bracket 156 can be supported on and connected to the first bracket 154 and can have a general U-shape with the base of the U-shaped abutting the first bracket 154. A threaded shaft 158 can pass through the two legs of the U-shape. The mode select lever 32 can include a collar 160 rotatably mounted on the threaded shaft 158 at location that is between the two legs of the U-shape. The mode select lever 32 can pivot relative to the second bracket 156 about the threaded shaft 158. A nut 162 and the threaded shaft 158 can secure the mode select lever 32 to the second bracket 156.

The selector assembly 22 can include a biasing structure 164 connected to each of the second bracket 156 and the mode select lever 32 and bias the mode select lever 32 toward the two-wheel drive slot 56 and the four-wheel drive slot 66 and away from the unlock slot 58 and the all-lock slot 68. For example, the biasing structure 164 can be a coil spring that includes a first end connected to the mode select lever 32 and a second end connected to the second bracket 156. The ends of the biasing structure 164 are obstructed from view by the second bracket 156 in the Figures. The threaded shaft 158 can pass through the center of the coil of the biasing structure 164.

The first interlocking lever 86 can include a first slot 166 and the front differential lever 140 can include a second slot 168 that permit the mode select lever 32 to selectively engage with and disengage from the levers 86, 140. The mode select lever 32 can be spaced away from the front differential lever 140 when the mode select lever 32 engages the first interlocking lever 86 and can be spaced away from the first interlocking lever 86 when the mode select lever 32 engages the front differential lever 140.

Figure 3:
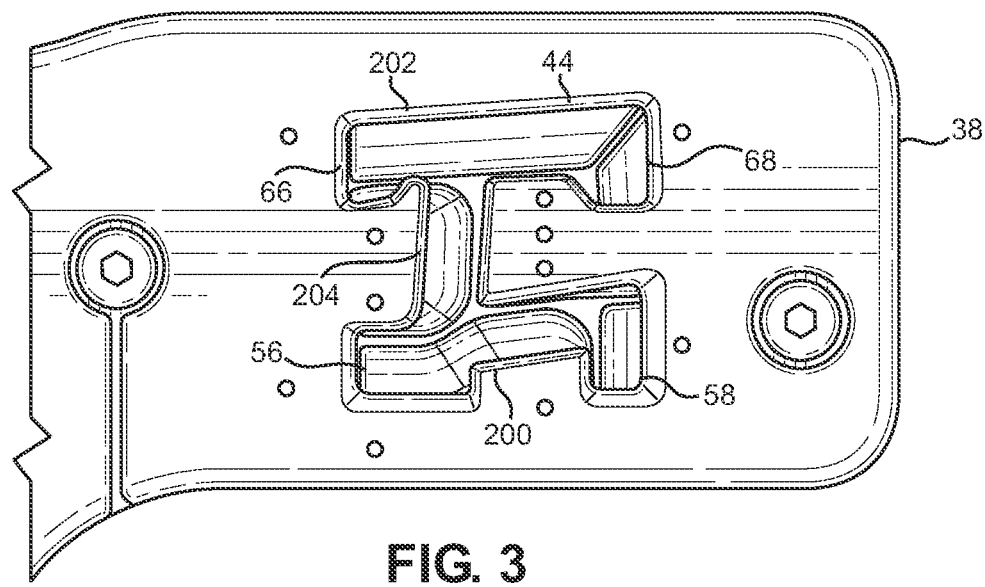
FIG. 3 is a top view of a portion of the reaction cable differential interlock system of FIG. 2 with a mode select lever omitted.

Referring to FIGS. 3 and 4 collectively, the mode select lever 32 can move into the first slot 166 and engage the first interlock lever 86 when the mode select lever 32 moves between the two-wheel drive slot 56 and unlock slot 58 or is placed in either of the slots 56, 58. The mode select lever 32 can pivot the first interlocking lever 86 when the mode select lever 32 moves between the two-wheel drive slot 56 and unlock slot 58. The mode select lever 32 can move into the second slot 168 and engage the front differential lever 140 when the mode select lever 32 moves between the four-wheel drive slot 66 and the all-lock slot 68 or is placed in either of the slots 66, 68.

The cable 36 can transmit motion of the mode select lever 32 to the lock lever 134 when the mode select lever 32 moves between the two-wheel drive slot 56 and unlock slot 58. Referring to FIG. 2, the cable 36 can move the lock lever 134 to the locked position when the mode select lever 32 is in the two-wheel drive slot 56. Referring to FIGS. 11B and 11C, the cable 36 can move the lock lever 134 to the unlocked position when the mode select lever 32 is in the unlock slot 58 and the shift lever 30 is in the first gate slot 42 or in any of the mode slots 48, 50, 52, 54.

Figure 6:
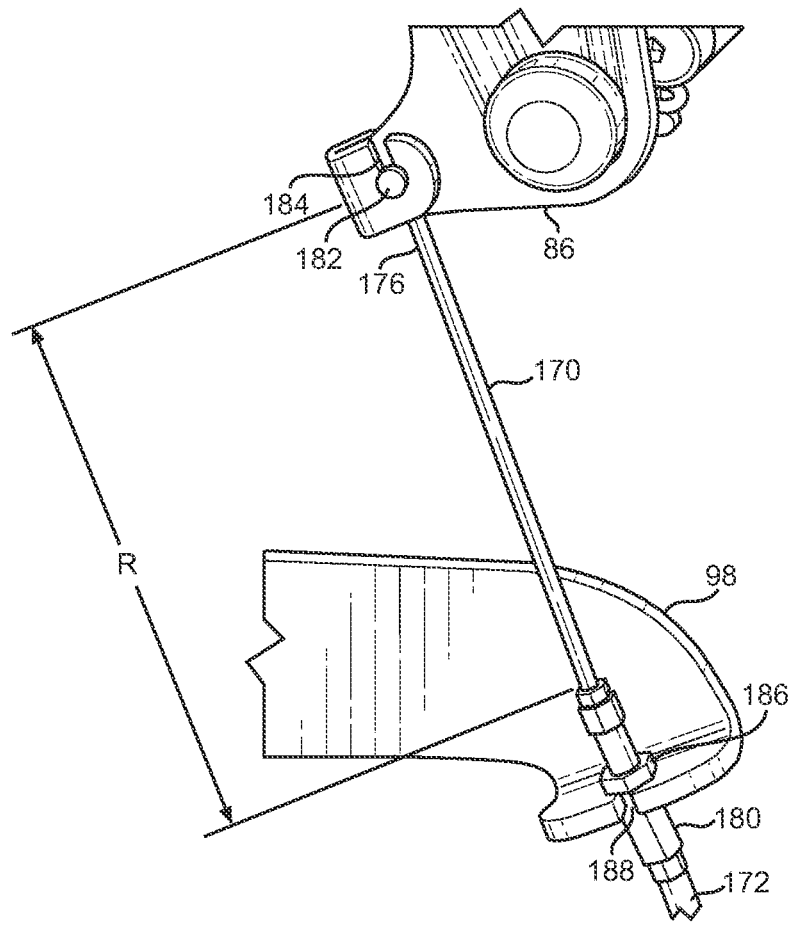
FIG. 6 is an enlarged view of a portion of FIG. 5 showing two connections between a single cable and the linkage mechanism.

The system 20 can rely on a feature of the cable 36 that can permit the cable 36 to transmit motion of the second interlock lever 98 to the lock lever 134 without moving the mode select lever 32. Referring to FIGS. 5 and 6, the cable 36 can include an inner wire 170, an outer casing 172 and a protective covering 174. Returning to FIGS. 11B and 11C, the inner wire 170 can be described as being in tension when the mode select lever 32 is in the unlock slot 58 and the lock lever 134 is in the unlock position because the lock lever 134 has rotated the torsion spring 94 against the bias of the torsion spring 94 which, in turn, applies a tension force on the inner wire 170. The mode select lever 32 can release this tension force when the mode select lever 32 is placed in the two-wheel drive slot 56 (FIG. 11B) and the torsion spring 96 returns the lock lever 134 to the locked position shown in FIG. 11C. Thus, the cable 36 can be described as a pull cable.

The system can use a reaction casing method for moving the inner wire 170 or the outer casing 172. According to the reaction method, the inner wire 172 can be pulled by the first interlock lever 86 while the stiff outer casing 172 is held or pushed by the second interlock lever 98. The effect at the other end of the cable 36 is the same in both cases—the length S (FIG. 7) of the inner wire 170 protruding out from the outer casing 172 becomes longer or shorter. This operation can be possible because the first end 180 of the outer casing 180 is movable relative fixed structures of the vehicle 10 such as, but not limited to, the bracket structure 80, the instrument panel 23, the frame assembly 16, or other structure(s) not directly connected to or not movable with the second interlock lever 98 about the fourth axis A4. Thus, a single cable (i.e., the cable 36) can be used to actuate the lock lever 134 with either the shift lever 30 or the mode select lever 32.

Figure 7:
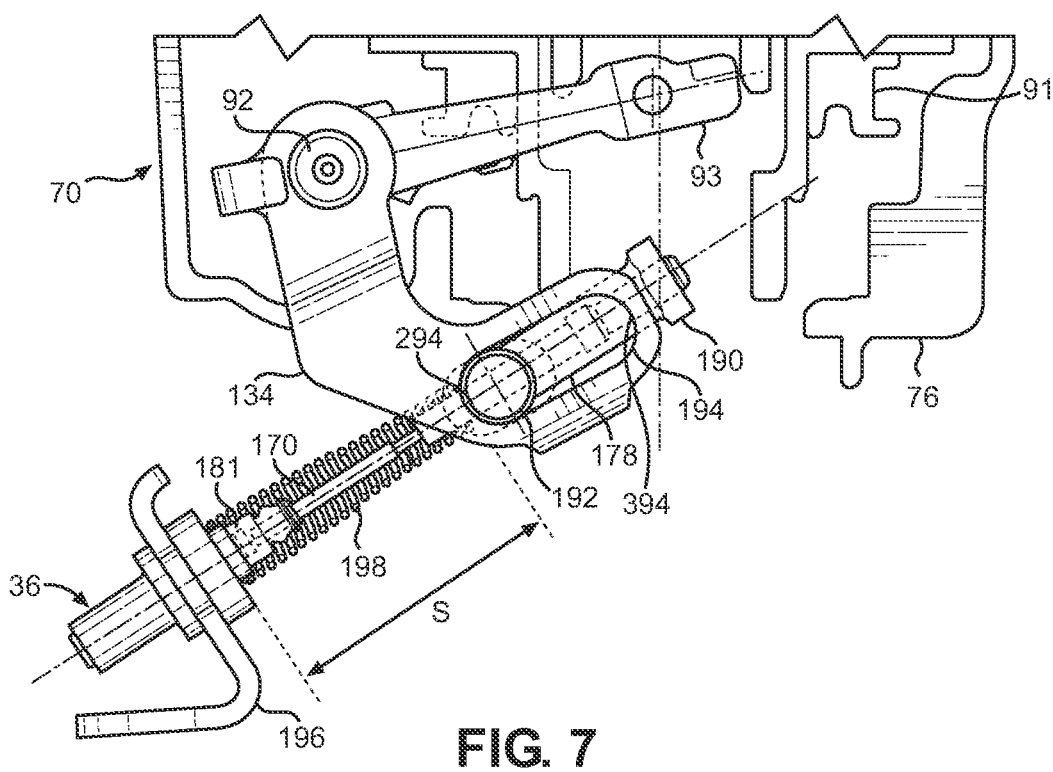
FIG. 7 is a top view of a portion of the rear differential assembly of FIG. 2 with a portion of the gear casing cut away and shows an interaction of a lock lever with a shift fork and a lock collar of the rear differential assembly.
Figure 8:
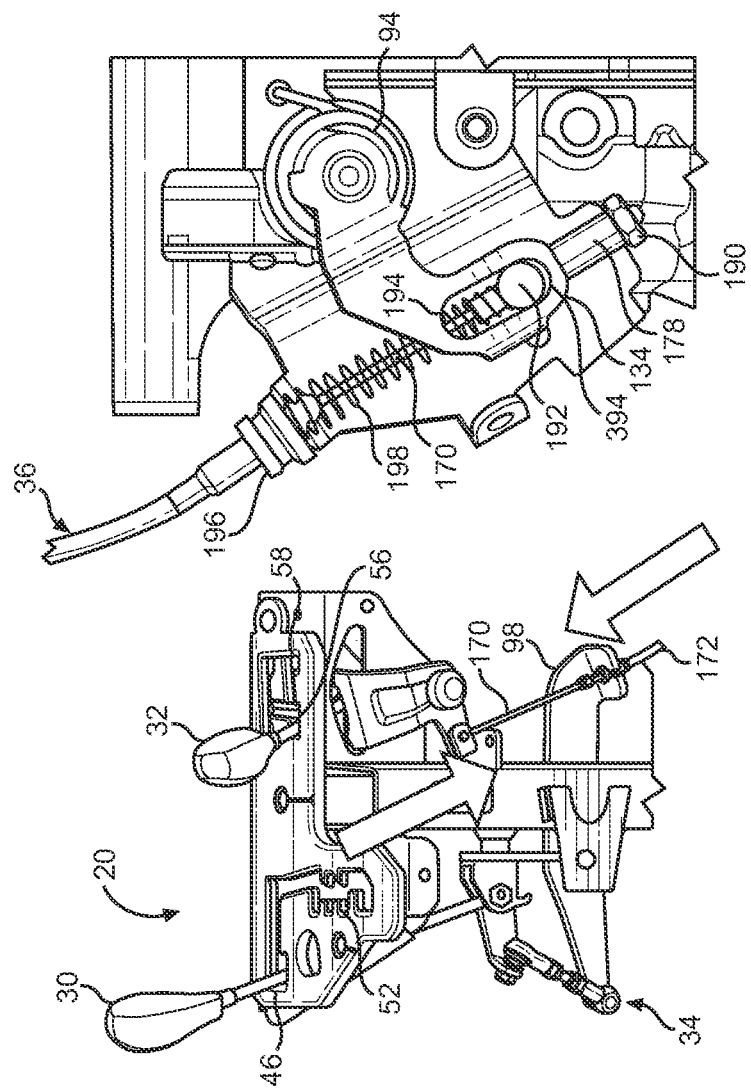
FIGS. 8A-8C show a shift pattern range, locations of a shift lever and the mode select lever, and a location of the lock lever, respectively, when the shift lever is in a park slot and the mode select lever is in a two-wheel drive slot.

Referring to FIGS. 2 and 4-7, the inner wire 172 can include a first end 176 connected to the first interlock lever 86 and a second end 178 connected to the lock lever 134. Referring to FIGS. 5 and 7, the outer casing 172 can include a first end connected to the second interlock lever 98 and a second end 181 (FIG. 7) adjacent to the rear differential assembly 70. The mode select lever 32 can pivot the first interlock lever 86 so that the first interlock lever 86 56 pulls on the first end 176 when the mode select lever 32 moves into the unlock slot 58. Since the second interlock lever 98 is held stationary while the mode select lever 32 moves into the unlock slot 58, a length R (FIG. 6) of the inner wire 170 between the first end 176 of the inner wire 170 and the first end 180 of the outer casing can increase. Increasing the length R can decrease a length S (FIG. 7) of the inner wire 170 between the second end 178 of the inner wire 170 and the second end 181 of the outer casing 172.

The outer casing 172 can include a first end 180 connected to the second interlock lever 98. The linkage mechanism 34 can push on the first end 180 when the shift lever 30 moves from the park slot 46 to the corner 128 or to any location along the first segment 124 of the first gate slot 42 and into any of the slots, such as slots 48, 50, 52, 54. Moving the first end 180 of the outer casing 172 can also increase the length R and reduce the length S when the first interlock lever 86 is held stationary.

Any movement of the linkage mechanism that increases the length R can be referred to as a pull because the system 20 can employ the tension of the pull-type cable 36 to pull the lock lever 134 into the unlock position against the bias of the torsional spring 96. Thus, moving the shift lever 30 from the park slot 46 into any of the corner 128 and the slots 48, 50, 52, 54 effectively is a pull on the inner wire 170 when the mode select lever 32 is in the unlock slot 58. Conversely, moving the shift lever 30 from any of the any of the corner 128 and the slots 48, 50, 52, 54 decreases the length R and releases the tension force, thereby enabling the bias of the torsion spring 94 to move the lock lever 134 to the locked position.

Referring to FIG. 6, the first end 176 of the inner wire can include a cylindrical fitting 182 and the first interlock lever 86 can include a first cable slot 184. The inner wire 170 can be pressed into the cable slot 184 with the cylindrical fitting 182 abutting the first interlock lever 86. The cylindrical fitting 182 and the first cable slot 184 can maintain a connection between the inner wire 170 and the first interlock lever 86 when the mode select lever 32 moves, for example, between the two-wheel drive slot 56 and the unlock slot 58.

The first end 180 of the outer casing 172 can include a screw fitting 186 and the second interlock lever 98 can include a second cable slot 188. The outer casing 172 can be pressed into the second cable slot 188 with the screw fitting 188 abutting the first interlock lever 86. The screw fitting 186 and the second cable slot 188 can maintain a connection between the outer casing 172 and the second interlock lever 98 when the shift lever 30 moves between the corner 128 of the first gate slot 42 and the park slot 46.

FIG. 7 is a top view of the rear differential assembly 70 with a portion of the gear casing 76 cut away to show an interaction between the lock lever 134, the shift fork 93 and the lock collar 91. The lock lever 134 can rotate the shaft 92, which, in turn, can pivot the shift fork 93 to slide the lock collar 91 as described above with respect to FIG. 13.

Referring to FIG. 7, the second end 178 of the inner wire 170 can include a threaded adjuster 190 and a joint pin 192, the lock lever 134 can include a lost motion slot 194. The rear differential assembly 70 can be rigidly mounted to the frame assembly 16 and the frame assembly 16 can include a cable bracket 196. The inner wire 170 and the outer casing 172 can pass through the cable bracket 196 and the joint pin 192 can be mounted in the lost motion slot 194 so that the joint pin 192 slides within the elongated slot 194.

The system 20 can include a cable spring 198 that is connected to the cable bracket 196 and the threaded adjuster 190. The cable spring 198 can stretch when the joint pin 192 moves away from the cable bracket 196 and contract when the joint pin 192 moves toward the cable bracket 196. That is, the cable spring 198 can bias the second end 178 of the inner wire toward the cable bracket 196.

FIGS. 8A-11C illustrate operational aspects of the system 20 when the shift lever 30 moves between the park slot 46 and the drive slot 52 and when the mode select lever 32 moves between the two-wheel drive slot 56 and the unlock slot 58. In FIGS. 8A, 9A, 10A, and 11A, "P" corresponds to the park slot 46, "R" corresponds to the reverse slot 48, "N" corresponds to the neutral slot 50, "H" corresponds to the drive slot 52, "L" corresponds to the low slot 54, "Turf" corresponds to the unlock slot 58, "2WD" corresponds to the two-wheel drive slot 56, "4WD" corresponds to the four-wheel drive slot 66 and "Lock" corresponds to the all-lock slot 68.

Generally, the mode select lever 32 can place the rear differential assembly 70 in the locked mode when the mode select lever 32 is in any of the two-wheel drive slot 56, the four-wheel drive slot 66 and the all-lock slot 68, and in the unlocked mode when in the unlock slot 58. The system 20 can input two stages of movement to the cable 36 in order to place the rear differential assembly 70 in the unlocked mode. FIGS. 8A-11C show how the system 20 can input the two stages of movement and permit the shift lever 30 to place the rear differential assembly 70 in the locked mode when the shift lever 30 is in the park slot 46, regardless of the position of the mode select lever 32. Further, FIGS. 8A-11C show that when the shift lever 30 is in the slots 48, 50, 52, 54, movement of the mode select lever 32 determines the lock condition of the rear differential assembly 70. Thus, the system 20 can permit a normal operation of the mode select lever 32.

Referring to FIGS. 8B and 8C, the linkage mechanism 34 can pivot the second interlock lever 98 when the shift lever 30 is in the park slot 46 to decrease the length R and the mode select lever 32 can pivot the first interlock lever 86 to further decrease the length R and allow the bias of the torsion spring 94 to move the lock lever 134 into the locked position when the mode select lever 32 is in the two-wheel drive slot 56. As a result of these inputs to the cable 36, the joint pin 192 can be pushed away from the cable bracket 196 by the cable spring 198 from the position shown in FIG. 9C to be adjacent to the far end 394 of the lost motion slot 194 as shown in FIG. 8C. Comparing FIGS. 8C and 9C, the movement of the joint pin 192 within the lost motion slot 194 can absorb the input from the cable 36, the torsion spring 94 can maintain the lock lever 134 in the locked position, and the rear differential assembly 70 can be maintained in the locked mode.

Figure 9:
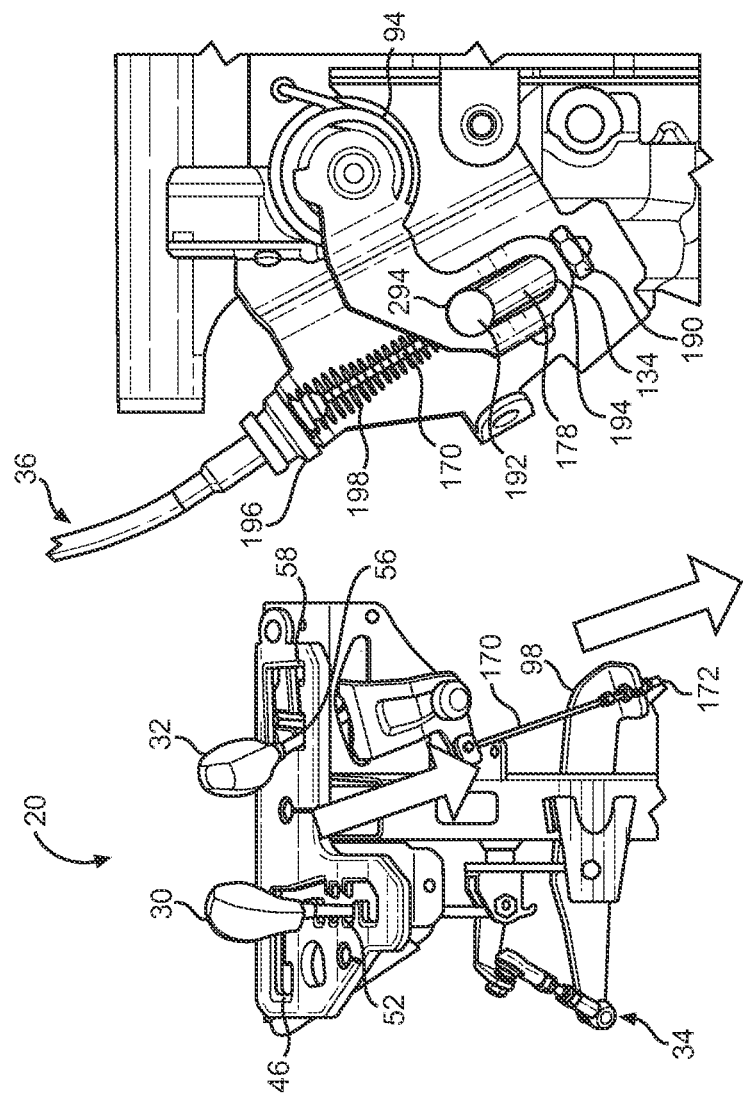
FIGS. 9A-9C show a shift pattern range, locations of the shift lever and the mode select lever, and a location of the lock lever, respectively, when the shift lever is in a drive slot and the mode select lever is in the two-wheel drive slot.
Figure 10:
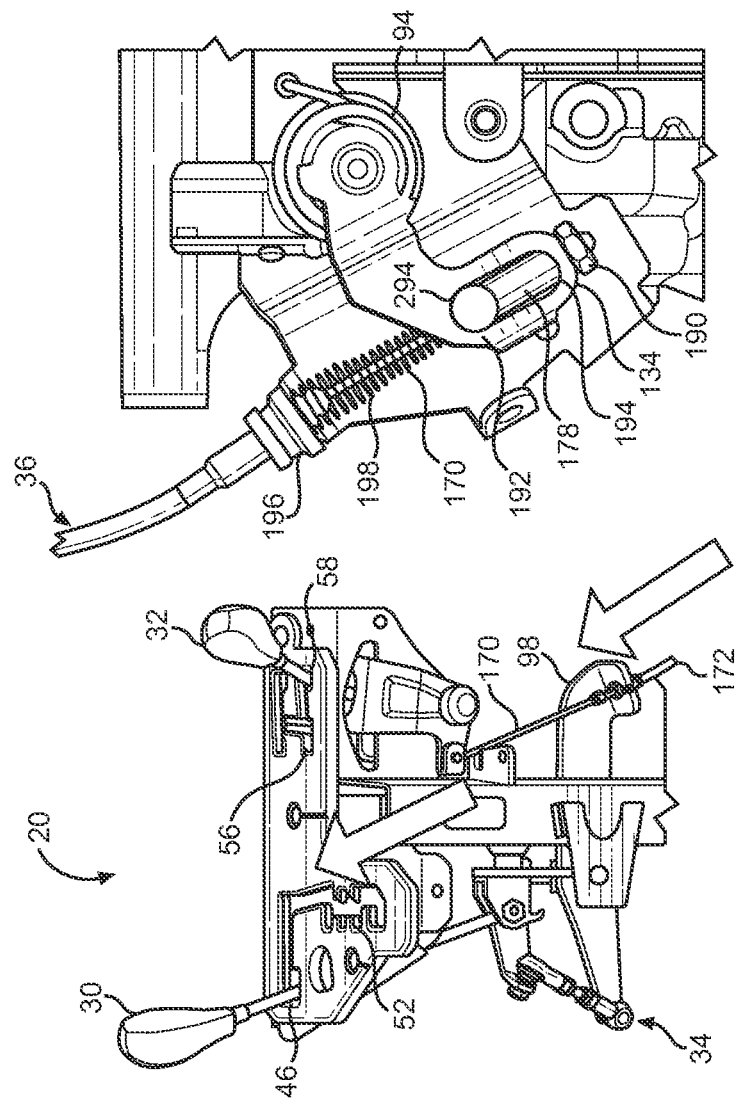
FIGS. 10A-10C show a shift pattern range, locations of the shift lever and the mode select lever, and a location of the lock lever, respectively, when the shift lever is in the park slot and the mode select lever is in a unlock slot.

Referring to FIGS. 9B and 9C, the linkage mechanism 34 can pivot the second interlock lever 98 to make the length R longer when the shift lever 30 is in the drive slot 52. Comparing FIGS. 8C and 9C, the result of these inputs to the cable 36 can pull the joint pin 192 toward the cable bracket 196 from the position shown in FIG. 8C to be adjacent to the near end 294 of the lost motion slot 194, as shown in FIG. 9C. By increasing the length R from FIG. 8B to FIG. 9B, the length S decreases from FIG. 8C to FIG. 9C The movement of the joint pin 192 within the lost motion slot 194 can absorb the input from the cable 36, the torsion spring 94 can maintain the lock lever 134 in the locked position, and the rear differential assembly 70 can be maintained or placed in the locked mode.

Referring to FIGS. 10B and 10C, the linkage mechanism 34 can pivot the second interlock lever 98 to decrease the length R and the first interlock lever 86 to increase the length S when the shift lever 30 is in the park slot 46 and the mode select lever 32 is in the unlock slot 58 Comparing FIGS. 8C and 10C, the result of these inputs to the cable 36 can pull the joint pin 192 away from the far end 394 of the lost motion slot 194, as shown in FIG. 8C, to be adjacent to the near end 294 of the lost motion slot 194, as shown in FIG. 10C. The movement of the joint pin 192 within the lost motion slot 194 can absorb the input from the cable 36 and the torsion spring 94 maintains the lock lever 134 in the locked position and the rear differential assembly 70 is placed in the locked mode despite the mode select lever 32 being in the unlock slot 58.

Although FIGS. 9C and 10C show the joint pin 192 adjacent to the near end 294 of the lost motion slot, the kinematics of the system 20 can be modified so that the proximity of the joint pin 192 to the near end 294 is different from the proximities shown in FIGS. 9C and 10C. For example, the ratio of the lengths of the levers can be predetermined to move the joint pin 192 closer to or farther from the near end 294, as desired. Further, by predetermining the relationship between the lengths of the levers of the system 20 and the proximity of the joint pin 192 to the near end 294, a predetermined condition can be established for making assembly and maintenance adjustments via the threaded adjuster 190.

Referring to FIGS. 11B and 11C, the linkage mechanism 34 can pivot the second interlock lever 98 to increase the length R and pivot the first interlock lever 86 to increase the length R when the shift lever 30 is in the drive slot 52 and the mode select lever 32 is in the unlock 58. Comparing FIGS. 10C and 11C, the result of these inputs to the cable 36 can cause the joint pin 192 to pull the lock lever 134 from the locked position shown in FIG. 10C to the unlocked position shown in FIG. 11C and the rear differential assembly 70 is placed in the unlocked mode.

Conversely, when the shift lever 30 is moved from the drive slot 52 to the park slot 46 while the mode select lever 32 in in the unlock slot 58, the linkage mechanism 34 can pivot the interlock lever 98 to decrease the length R and the pivot the first interlock lever 86 to increase the length R. As a result of these inputs to the cable 36, the length S increases, the joint pin 192 moves away from the cable bracket 196, and the torsion spring 94 can pivot the lock lever 134 into the locked position and the rear differential assembly 70 can be placed in the locked mode despite the mode select lever 32 being in the unlock slot 58.

The operations of the system 20 described above equally apply to movement of the shift lever 30 between the park slot 46 and any of the other slots 48, 50, 54 when the mode select lever 32 is in the two-wheel drive slot 56 or the unlock slot 58.

Thus, the system 20 can permit the shift lever 30 to selectively operate the rear differential assembly 70 in the locked mode and the unlocked mode when the mode select lever 32 is in the unlock slot 58. Further, the linkage mechanism 34 can permit a single cable (i.e., the cable 36) to transmit motion inputs by both the shift lever 30 and the mode select lever 32. Thus, the system 20 can provide a simple construction that also can provide an operator of the vehicle 10 with a positive perception of the process for parking the vehicle 10 with a reduced number of actions for placing the vehicle's differential into locked or unlocked states.

Further, the system 20 can simplify assembly and maintenance of the system 20 since adjustment of only a single cable (i.e., the cable 36) is needed so that the levers 30, 32, 134 can move into the appropriate positions according to the intended movement of the levers 30, 32, 134. For example, the adjustment can be based on a predetermined clearance between the joint pin 192 and the end of the lost motion slot 194 when the shift lever 30 is in the park slot 46 and the mode select lever 32 is in the unlock slot 58.

The bracket structure 80 can be mounted on the instrument panel 23 or on the frame assembly 16 at a location that is adjacent to the instrument panel 23. Since the levers 30, 32 and the linkage mechanism 34 can be mounted on the instrument panel 23, exposure of the system 20 can be reduced as compared to when mounting the levers 30, 32 and the linkage mechanism on the floor of the vehicle 10 or in a console that is mounted on the floor of the vehicle 10. This can be advantageous for a vehicle 10 that is intended for use on unimproved paths or other off-road terrain such as, but not limited to, fording a shallow body of water, and driving across muddy or sandy terrain. Although the cable 36 may be exposed to debris, mud and water, the protective covering 174 can be a sealing structure for the cable 36. Nonetheless, the system 20 can be configured for easy access for servicing and maintenance.

Referring to FIG. 5, the shift lever 30 can pivot the arm 102 in a clockwise direction, as viewed in FIG. 5, from a first position shown in solid lines to a second position in phantom lines when the shift lever 30 moves from the park slot 46 to the corner 128 of the first gate slot 42 and when the shift lever 30 moves along the first segment 124 of the first gate slot 42 or into any of the slots 48, 50, 52, 54. FIG. 5 shows the position of the second interlock lever 98 in phantom when the shift lever 30 is in the corner 128 or in the first segment of the first gate slot 42 or into any of the slots 48, 50, 52, 54.

The first axis A1 can intersect the first end 120 of the second link 104 shown in phantom when the shift lever 30 is in the corner 128 or in any position along the first segment 124. The first axis A1 can intersect or be adjacent to a pivot axis of the second link 104 when the shift lever 30 moves along the first segment 124. The arm 102 can pivot about the first end 120 of the second link 104 when the shift lever 30 pivots about the first axis A1. Thus, the arm 102 can avoid transmitting an input or can transmit an input that is small enough so that the cable 36 does not move the lock lever 134 enough to change the current operating mode of the rear differential assembly 70.

Although the linkage mechanism 34 can transmit motion of the shift lever 30 between the first segment 124 and any of the slots 48, 50, 52, 54 to the outer casing 170, the motion transmitted to the outer casing 170 can be less than the motion needed to move the select lever 134 enough to change the current operating mode of the rear differential assembly 70.

Figure 12:
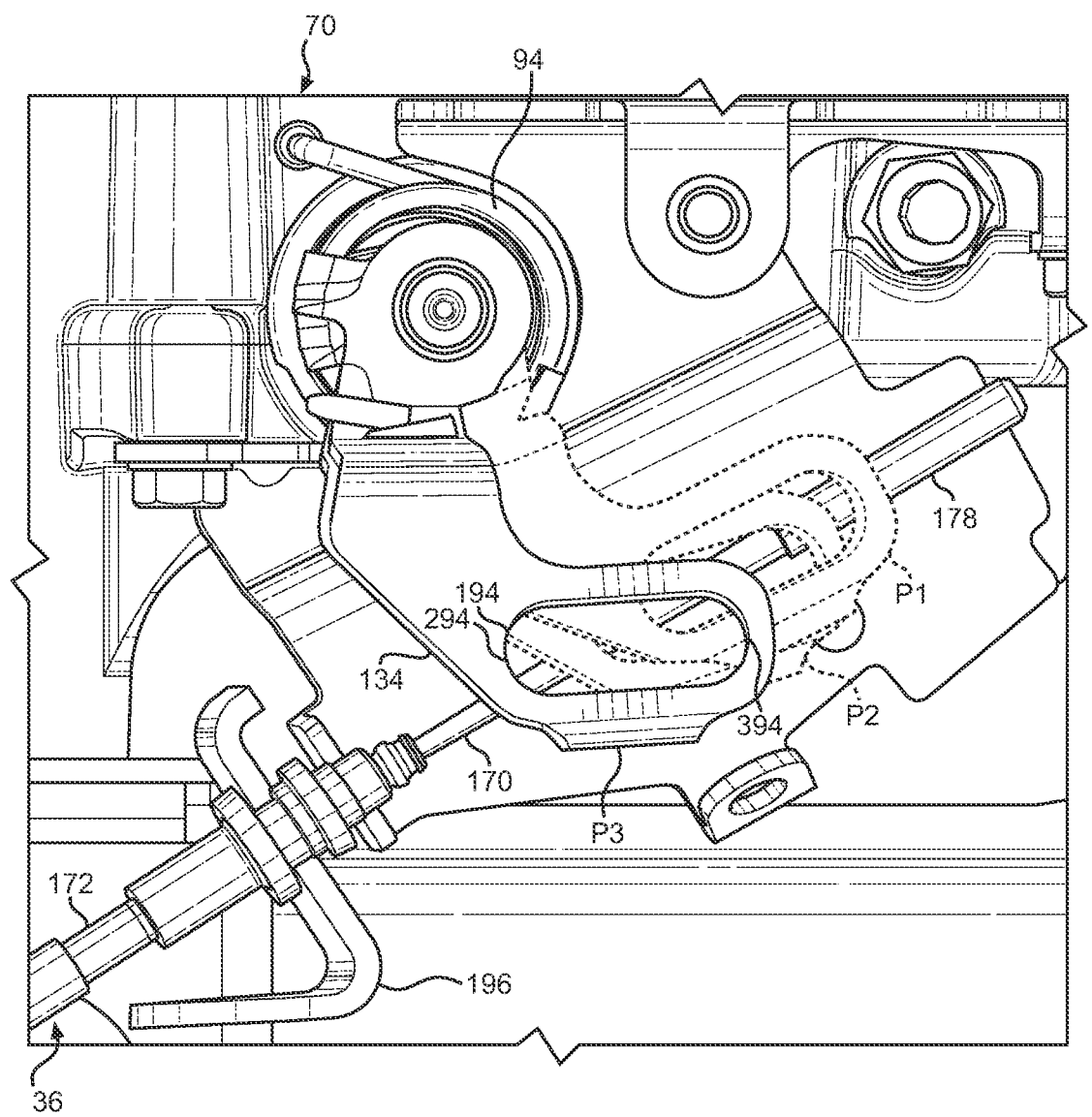
FIG. 12 is an enlarged view of a portion of the rear differential assembly of FIG. 2 and shows an overstroke position of the lock lever in solid lines and a lost motion position and a locked position of the lock lever in phantom lines.

FIG. 12 shows the locked position P1 (in phantom), the unlocked position P2 (in phantom) and an overstroke position P3 (in solid lines) of the lock lever 134. The joint pin 192 is omitted from FIG. 12 for clarity and simplicity of the drawing. The unlocked position P2 can correspond to the location of the lock lever 134 shown in FIG. 11C. The overstroke position P3 can be different from the unlocked position shown in FIG. 11C by a predetermined amount. The overstroke position is displaced relative to the unlocked position in a clockwise direction, as viewed in FIG. 12. The lock lever 134 can be placed in the overstroke position P3 when the shift lever 30 is in, but not resting against, the left side of any of the slots 48, 50, 52, 54 (as viewed in FIGS. 2, 3 and 5) or the mode select lever 32 is in, but not resting against, the left side of the unlock slot 58 (as viewed in FIGS. 2, 3 and 5).

The inner wire 170 can move through a stroke length when the cable 36 moves the lock lever 134 between the locked position and the unlocked position. It can be possible to simultaneously move the shift lever 30 into the park slot 46 and the mode select lever 32 into the unlock slot 58. This simultaneous movement can displace the joint pin 192 through a distance that is greater than the lock stroke length. As a result, the lock lever 134 can be placed in the overstroke position P3 shown in FIG. 12.

In order to compensate for this possible overstroke position P3, the lock lever 134 or the shift fork 93 can be connected to the rotary shaft 92 by a lost motion coupling such as, but not limited to, the torsion spring 594 so that the overstroke is not transmitted to the lock collar 91 or is reduced if transmitted to the lock collar 91. Alternatively, the lock collar 91 can be configured to move by the overstroke amount without adverse effects. For example, the lock collar 91 can be configured to contact the 2nd casing half 79 or the left bearing 85L.

Returning to FIG. 13, the pin(s) 96 can be configured so that the pin(s) 96 can avoid partial engagement when the shift lever 30 is in the park slot 46 and/or the mode select lever 32 is in the any of the slots 56, 66, 68. Full engagement of the pin(s) 96 with the left output cam 75L can achieve an intended contact pressure on the pin(s) 96. In contrast, a prolonged partial engagement or highly repeated cycles of partial engagements of the pin(s) 96 with the left output cam 75L can impair an intended operation or desired performance of the rear differential assembly 70.

The transmission 12 can drive the rear wheels 21L, 21R when the mode select lever 32 is in the two-wheel drive slot 56 and the unlock slot 58. The transmission 12 can drive all four wheels 18L, 18R, 21L, 21R and the front differential 15 can operate in an unlocked mode when the mode select lever 32 is in the four wheel drive slot 66. The transmission 12 can drive all four wheels 18L, 18R, 21L, 21R and the front differential 15 can operate in a locked mode when the mode select lever 32 is in the all-lock slot 68.

Returning to FIG. 4, a first end of the front clutch control cable 28 can be connected to the mode select lever 32 via the clutch lever 142 and a second end can be connected to a clutch that selectively connects and disconnects the front propeller shaft 13 and the front differential assembly 15. The clutch can be located adjacent to the front differential 15 or adjacent to or incorporated in the transmission 12.

Referring to FIGS. 3 and 4, the second gate slot 44 can include a first segment 200, a second segment 202 and a third segment 204 that connects the first segment 200 to the second segment 202. The mode select lever 32 can pivot the clutch lever 142 about the collar 148 to selectively pull or not pull on the clutch cable 28 when the mode select lever 32 moves along the third segment 204 between the first and second segments 200, 202. The mode select lever 32 cannot pull the clutch control cable 28 to cause the clutch cable 28 to disengage the clutch when the mode select lever 32 is in the first segment 200 and pull of the clutch control cable 28 to cause the clutch control cable 28 to engage the clutch when the mode select lever 32 is in the second segment 202.

A first end of the front differential control cable 26 can be connected to the front differential lever 140 and a second end can be connected to the front differential assembly 15. The mode select lever 32 can pivot the front differential lever 140 about the collar 146 to selectively pull or not pull on the front differential cable 26 when the mode select lever 32 moves between the four-wheel drive slot 66 and the lock slot 68. The mode select lever 32 cannot pull the front differential cable 26 to cause the front differential cable 26 to unlock the front differential assembly 15 when the mode select lever 32 is in the four-wheel drive slot 66 and pull of the front differential cable 26 to lock the front differential assembly 15 when the mode select lever 32 is in the lock slot 68.

The transmission control cable 24 can transmit movement of the shift lever 30 into the reverse slot 48 to the actuator 40 such that the actuator 40 engages a reverse gear. The transmission control cable 24 can transmit movement of the shift lever 30 into the neutral slot 50 to the actuator 40 such that the actuator 40 disengages all of the gear ratios. The transmission control cable 24 can transmit movement of the shift lever 30 into the drive slot 52 to the actuator 40 such that the actuator 40 engages an appropriate forward drive gear ratio and controls the shifting between the different forward drive gear ratios in a predetermined manner. The transmission control cable 24 can transmit movement of the shift lever 30 into the low slot 54 to the actuator 40 such that the actuator 40 engages an appropriate forward drive gear ratio and controls the shifting between the different forward drive gear ratios in a predetermined manner that is different as compared to when the shift lever 30 is in the drive slot 52.

The frame assembly 16 can support the power source 11, the transmission 12, the differentials 15, 70, the wheels 18L, 18R, 21L, 21R, the instrument panel 23, and other structures and systems of the vehicle 10. The frame assembly 16 can surround a passenger space 17 and support one or more seats (not shown) in the passenger space 17.

The power source 11 can be an internal combustion engine, an electric motor or a hybrid of an internal combustion engine and an electric motor. The power source, when configured as an internal combustion engine or a hybrid power source, can have the engine output axis oriented in the longitudinal direction or in the traverse direction of the vehicle 10. The engine can be mounted forward of the front driveshafts (not shown), rearward of the rear driveshafts 19L, 19R, or intermediate the front and rear driveshafts. In the exemplary embodiment of FIG. 1, the power source 11 is configured as a longitudinally-oriented mid-mounted internal combustion engine.

The transmission 12 can be an automatic transmission, a manual transmission, or a semi-automatic transmission. The transmission 12 can include an input shaft, an output shaft, and a speed ratio assembly that connects the input shaft to the transmission output shaft such that the transmission output shaft can rotate at variable speeds relative to the input shaft. The speed ratio assembly can be a stepped speed ratio assembly or a continuously variable speed ratio assembly.

While certain embodiments of the invention are described above, it should be understood that the invention can be embodied and configured in many different ways without departing from the spirit and scope of the invention.

For example, embodiments are disclosed above in which the cables 26, 28, 36 are configured as pull cables. However, the disclosed system 20 can include push/pull cables instead of the pull cables 26, 28, 36. The transmission cable 24 can be a pull cable or a push/pull cable. The cable spring 198 can be omitted if the cable 36 is configured as a push-pull cable.

Embodiments are disclosed above in the context of the vehicle 10 shown in FIG. 1. However, the disclosed system 20 can be used with any vehicle that is configured for travel along any one or combination of improved, unimproved, and unmarked paths. For example, embodiments are intended to include or otherwise cover any type of automobile, including a passenger car, minivan, truck, other types of all-terrain vehicle (ATV), semi-tractor, off-highway vehicle, etc.

Instead of an inverted J-shape, the first gate slot 42 can have any appropriate shape such as, but not limited to, an H-shape, a stair shape, or a J-shape as long as the shift lever 30 transmits a motion to the outer casing 170 when the shift lever 30 is placed in a position that places the transmission 12 in a park mode. Further, the first gate slot 42 can include additional gate slots on a side of the first segment 124 that is opposite to the drive slot 52. The additional gate slots can include an upshift slot and a downshift slot that can permit the operator of the vehicle 10 to manually change the forward drive gear ratio.

Any one of the collars 144, 146, 148 can be replaced with a shaft.

The rear differential assembly 70 can be rigidly mounted to the frame assembly 16 and the cable bracket 196 can be mounted to the frame assembly 16, as described above. However, alternate embodiments can include the cable bracket mounted on the gear casing 76 if the differential assembly 70 is movably mounted to the frame assembly 16.

Instead of the output cams 75L, 75R, the differential gearing 74 can include a planetary gear assembly that connects the rear driveshafts 19L 19R to the differential casing 73.

Instead of driving the rear wheels 21L, 21R, the vehicle 10 can be configured so that the transmission 12 drives the front wheels 18L, 18R when the mode select lever 32 is in the two-wheel drive slot 56 or the unlock slot 58 and selectively drives the rear wheels 21L, 21R when the mode select lever 32 is in the four-wheel drive slot 66 or the lock slot 68.

Alternate embodiments can omit the front differential assembly 15 and the clutch such that the transmission 12 drives only the rear wheels 21L, 21R.

In alternate embodiments the locked mode of the front differential 15 can be omitted. Alternatively, the front differential assembly 15 can be configured as a limited-slip differential that includes a mechanical structure that automatically locks the differential gearing when a predetermined difference in speed (or torque) occurs between the front wheels 19L, 19R and unlocks when the predetermined difference in speed (or torque) is absent. Alternatively, the locking mechanism of the front differential assembly 15 can be electrically and/or electronically activated and deactivated.

What is claimed is:

1. A reaction cable differential interlock system, comprising:
    a differential lock lever configured to be movably mounted on a differential gear assembly and connected to a differential lock collar of the differential gear assembly;
    a shift lever movable between a plurality of transmission mode positions;
    a mode select lever movable between a plurality of differential mode positions;
    a linkage mechanism coupled to the shift lever and the mode select lever; and
    a single cable extending from the linkage mechanism to the differential lock lever and configured to transmit motion of both the shift lever and mode select lever to the differential lock lever.

2. The reaction cable differential interlock system according to claim 1, wherein
    the linkage mechanism includes,
        a first lever including a first end connected to the single cable, and
        a second lever including a first end connected to the single cable and a second end connected to the shift lever, the mode select lever is configured to move the first lever when the mode select lever moves from one of the differential mode positions to a different one of the differential mode positions, and the shift lever is configured to move the second lever when the shift lever moves from one of the transmission mode positions to a different one of the transmission mode positions.

3. The reaction cable differential interlock system according to claim 2, wherein the single cable includes, an outer casing including a first end directly connected to the second lever and a second end adjacent to the differential gear assembly, and an inner wire located at least partially within and movable relative to the outer casing, the inner wire includes a first end directly connected to the first lever and a second end connected to the differential lock lever.

4. The reaction cable differential interlock system according to claim 1, further comprising:

a mounting bracket, wherein the linkage mechanism includes, a first link pivotally mounted to the mounting bracket, an arm pivotally mounted on the first link and fixed to the shift lever, a center plate pivotally mounted on the mounting bracket and including a first end connected to the single cable and a second end, a second link having a first end connected to the arm and a second end connected to the second end of the center plate, the shift lever is mounted on and pivots relative to the first link, and the arm moves when the shift lever pivots relative to the first link.

5. The reaction cable differential interlock system according to claim 4, wherein the first link pivots relative to the mounting bracket about a rotation axis, and the rotational axis intersects the first end of the second link when the first link pivots about the rotation axis.

6. The reaction cable differential interlock system according to claim 4, wherein the center plate includes a pivot collar spaced away from the first end and the second end and rotationally supported by the mounting bracket.

7. The reaction cable differential interlock system according to claim 1, wherein the differential lock lever includes a slot, and the cable includes a first end connected to the linkage mechanism, a second end, and a slider connected to the second end and received in the slot.

8. The reaction cable differential interlock system according to claim 7, further comprising:

a support bracket supporting a portion of the cable that is adjacent to the second end of the single cable; and a spring that abuts the support bracket and the slider, and biases the slider to one end of the slot.

9. A reaction cable differential interlock system for selectively moving a differential lock collar of a differential gear assembly between a locked state and an unlocked state, the reaction cable differential interlock system comprising:

a lock lever movably mounted on the differential gear assembly and connected to the differential lock collar, the lock lever being movable between a locked position configured to place the differential lock collar in the locked state and an unlocked position configured to place the differential lock collar in the unlocked state;

a mode select lever movable between a locked mode position and an unlocked mode position;

a shift lever pivotable about a first axis and movable between a park position and a plurality of drive mode positions;

a linkage mechanism coupled to the mode select lever and the shift lever and that includes a first link movable about a second axis that is different from the first axis; and a single cable connecting the linkage mechanism to the lock lever.

10. The reaction cable differential interlock system according to claim 9, wherein the lock lever is in the locked position when the mode select lever is in the locked mode position, the lock lever is in the unlocked position when the mode select lever is in the unlocked mode position and the shift lever is any one of the drive mode positions, and the lock lever is in the locked position when the mode select lever is in the unlocked mode position and the shift lever is in the park position.

11. The reaction cable differential interlock system according to claim 9, wherein the single cable includes a first end selectively connected to and movable by the mode select lever, a second end connected to the lock lever, and an intermediate portion connected to the shift lever, the lock lever is biased toward the locked position and includes a slot, and a slider is movably mounted in the slot.

12. The reaction cable differential interlock system according to claim 11, wherein the shift lever pivots about a first axis when the shift lever moves into and out of the park position, and the shift lever pivots about a second axis that is different from the first axis when the shift lever moves between the drive mode positions, the single cable is a pull cable that includes, an outer casing having a first end and a second, and an inner wire extending through the outer casing and protruding from the first end of the outer casing and the second end of the outer casing, the inner wire has a first end spaced away from the first end of the outer casing by first variable length and a second end spaced away from the second end of the outer casing by a second variable length, when the shift lever pivots about the first axis and moves out of the park position, the second lever increase the first length and decreases the second length to move the slider in the slot, and when the mode select lever moves from the locked position to the unlocked position, the first lever pulls on the inner wire and decreases the second length to move the lock lever to the unlocked position.

13. The reaction cable differential interlock system according to claim 11, wherein the shift lever pivots about a first axis when the shift lever moves into and out of the park position, and the shift lever pivots about a second axis that is different from the first axis when the shift lever moves between the drive mode positions, when the mode select lever is in the unlocked position and the shift lever pivots about the first axis and moves into the park position, the second lever is configured to decrease the first length and increase the second length, and the lock lever is biased into the locked position.

14. The reaction cable differential interlock system according to claim 9, wherein the linkage mechanism includes,
a first lever pivotally mounted on the mounted bracket and including a first end connected to the first end of the single cable and a second end selectively connected to the mode select lever,
a second lever including a first end connected to the single cable at the intermediate portion and a second end,
a first link, the shift lever pivotally mounted on the first link,
an arm pivotally connected to the first link and fixed to the shift lever, and
a second link having a first end pivotally connected to the arm and a second end pivotally connected to the second end of the second lever,
the single cable includes an outer casing and an inner wire passing through the outer casing,
the inner wire includes a first end connected to the first lever, a second end connected to the lock lever, and
the outer casing includes a first end connected to the second lever.

15. The reaction cable differential interlock system according to claim 14, further comprising:
a mounting bracket; and
a shift plate connected to the mounting bracket and including a first gate slot and a second gate slot, the first gate slot has a first segment that guides the shift lever to pivot about the first axis and a second segment that guides the shift lever to pivot about the second axis, wherein
each of the shift lever, the mode select lever, the first lever, the second lever, and the first link is pivotally connected to the mounting bracket,
the shift lever pivots about a first axis when the shift lever pivots relative to the first link, and the shift lever pivots about a second axis when the first link pivots relative to the mounting bracket,
the shift lever extends through and moves along the first gate opening when the shift lever pivots about the first axis or the second axis, and
the mode select lever extends through and moves along the second gate opening when the mode select lever moves between the locked position and the unlocked position.

16. The reaction cable differential interlock system according to claim 15, wherein the second axis intersects the first end of the second link and the arm pivots relative to the first end of the second link when the shift lever pivots about the second axis.

17. A reaction cable differential interlock system, comprising:
a shift lever movable between a plurality of transmission mode positions;
a mode select lever movable between a plurality of differential mode positions;
a linkage mechanism coupled to the shift lever and the mode select lever;
a lock lever movable between a locked position and an unlocked position;
a cable extending from the linkage mechanism to the lock lever, and configured to transmit motion of both the shift lever and mode select lever to the lock lever, wherein
the linkage mechanism is connected to the cable at two different locations on the cable.

18. The reaction cable differential interlock system according to claim 17, wherein
the linkage mechanism includes,
a first lever pivotally mounted on the mounted bracket including a first end connected to the first end of the cable and a second end selectively connected to the mode select lever,
a second lever including a first end connected to the cable at the intermediate portion and a second end, and
the cable includes,
an outer casing including a first end directly connected to the second lever, and
an inner wire passing through the outer casing, the inner wire includes a first end connected to the first lever and a second end connected to the lock lever.

19. An off-road vehicle, comprising:
the reaction cable differential interlock system according claim 18;
a power source;
a transmission selectively driven by the power source and including an actuator assembly that selectively operates the transmission in one of a park mode and a plurality of drive modes;
a second cable connected to the shift lever and the transmission;
a rear differential including a housing and a locking collar movably mounted inside of the housing between a locked position and an unlocked position; and
a propeller shaft connected to the transmission and the rear differential, wherein
the lock lever is movably mounted on the housing and connected to the lock collar to move the lock collar between the locked position and the unlocked position,
the shift lever is configured to apply an input force to the second cable when the shift lever moves between the transmission mode positions, and the second cable is configured to transmit the input to the actuator assembly,
the transmission mode positions include a park mode position, and
the actuator assembly is configured to operate the transmission in a park mode when the shift lever is in the park position such that the transmission rotationally locks the propeller shaft.

20. The off-road vehicle according to claim 19, wherein the rear differential includes a lost motion coupling that connects the lock lever to the to the locking collar.

* * * * *